US011513440B2

(12) United States Patent
Uchida

(10) Patent No.: US 11,513,440 B2
(45) Date of Patent: Nov. 29, 2022

(54) OPTICAL ELEMENT, OPTICAL SYSTEM, AND OPTICAL APPARATUS

(71) Applicant: CANON KABUSHIKI KAISHA, Tokyo (JP)

(72) Inventor: Kazue Uchida, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 318 days.

(21) Appl. No.: 16/674,400

(22) Filed: Nov. 5, 2019

(65) Prior Publication Data

US 2020/0150534 A1 May 14, 2020

(30) Foreign Application Priority Data

Nov. 13, 2018 (JP) ............................ JP2018-212708

(51) Int. Cl.

*G03F 7/09* (2006.01)
*G02B 1/115* (2015.01)
*G02B 5/20* (2006.01)
*G02B 7/00* (2021.01)

(52) U.S. Cl.

CPC .............. *G03F 7/091* (2013.01); *G02B 1/115* (2013.01); *G02B 5/205* (2013.01); *G02B 7/006* (2013.01)

(58) Field of Classification Search

CPC .. G02B 1/11–1/115; G02B 5/22; G02B 5/205
See application file for complete search history.

(56) References Cited

U.S. PATENT DOCUMENTS

2006/0110587 A1* 5/2006 Okami .................. G02B 5/205 428/216
2007/0178315 A1* 8/2007 Thomas ................. G02B 1/115 428/426
2015/0192783 A1 7/2015 Ishido et al.
2017/0285230 A1* 10/2017 Koga ..................... G02B 5/205
2018/0164479 A1 6/2018 Koga
2019/0107650 A1 4/2019 Uchida

FOREIGN PATENT DOCUMENTS

EP 2381280 A1 * 10/2011 ............ G02B 5/208
JP S5938701 A 3/1984
JP H11-023810 A 1/1999
JP 2007178822 A 7/2007
JP 2011-164494 A 8/2011
JP 5067133 B2 11/2012
JP 2017-040909 A 2/2017
JP 2017-187729 A 10/2017
WO 2013/161767 A1 10/2013

OTHER PUBLICATIONS

Machine translation of EP2381280. Retrieved Jan. 4, 2022.*
Notice of Reasons for Rejection issued in corresponding JP Patent Application No. 2018-212708, dated Sep. 6, 2022, pp. 1-7.

* cited by examiner

*Primary Examiner* — Prashant J Khatri
(74) *Attorney, Agent, or Firm* — Carter, DeLuca & Farrell LLP

(57) ABSTRACT

An optical element has an area in which a transmittance varies, includes first and second antireflection layers, and an absorption layer disposed between the first and second antireflection layers, and satisfies certain conditions.

13 Claims, 18 Drawing Sheets

OPTICAL ELEMENT, OPTICAL SYSTEM, AND OPTICAL APPARATUS

BACKGROUND OF THE INVENTION

Field of the Invention

The present invention relates to an optical element.

Description of the Related Art

An ND (neutral density) filter that limits a transmittance may be used for an optical element (optical filter) in an imaging apparatus. In particular, a gradation type ND filter is used in which a transmittance varies according to an area, in order to control the luminance of the image or to improve a varying sharpness of a contour of a defocus image (blurred image) (and a resultant image degradation).

Japanese Patent Laid-Open No. 2007-178822 discloses a gradation type ND filter having a different film thickness and optical density for each area. Japanese Patent No. 5067133 discloses an ND filter in which the reflectance is reduced by using an antireflection structure.

However, in the ND filter disclosed in Japanese Patent Laid-Open No. 2007-178822, the reflectance is not sufficiently reduced to obtain a high-quality image with reduced ghosts and flares. Japanese Patent No. 5067133 does not disclose the structure or antireflection effect relating to the gradation type ND filter.

SUMMARY OF THE INVENTION

The present invention provides an optical element, an optical system, and an optical apparatus having a high antireflection performance for areas having different transmittances.

An optical element according to one aspect of the present invention has an area in which a transmittance varies and includes first and second antireflection layers, and an absorption layer disposed between the first and second antireflection layers. The following conditional expressions are satisfied, $$|n_A-n_1|\leq 0.35$$

$$|n_B-n_2|\leq 0.35$$

where $n_A$ is a refractive index of a first film adjacent to the first antireflection layer in the absorption layer, $n_B$ is a refractive index of a second film adjacent to the second antireflection layer in the absorption layer, $n_1$ is a refractive index of a third film adjacent to the absorption layer in the antireflection layer, and $n_2$ is a refractive index of a fourth film adjacent to the absorption layer in the second antireflection layer.

An optical system and optical apparatus having the above optical element also constitute another aspect of the present invention.

Further features of the present invention will become apparent from the following description of exemplary embodiments with reference to the attached drawings.

DESCRIPTION OF THE EMBODIMENTS

Referring now to the accompanying drawings, a description will be given of embodiments according to the present invention.

Figure 1A:
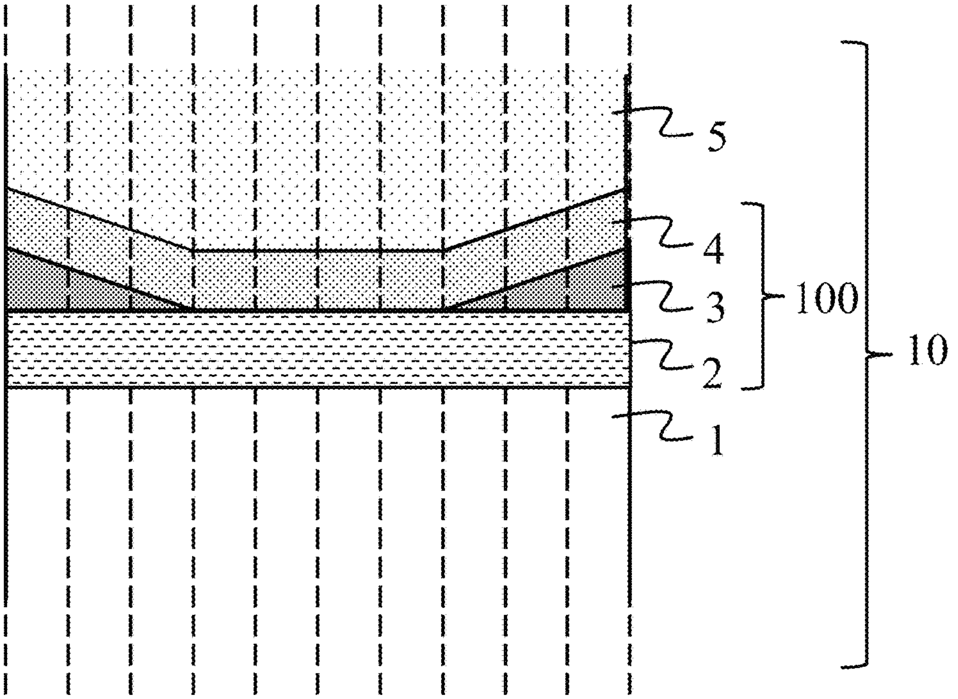
FIGS. 1A and 1B explain an optical element according to this embodiment (Examples 1 to 3).
Figure 1B:
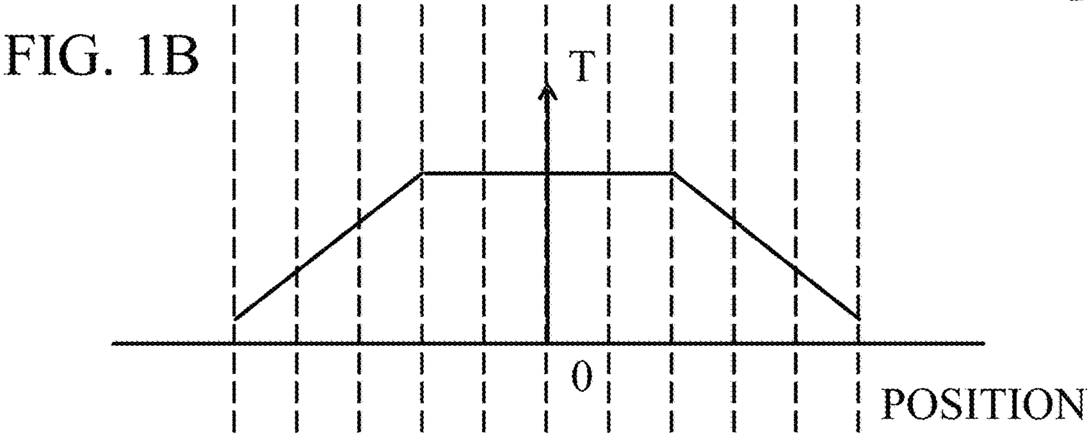

Referring now to FIGS. 1A and 1B, a description will be given of a schematic configuration of an optical element 10 according to this embodiment. FIGS. 1A and 1B explain the optical element 10, FIG. 1A is a sectional view of the optical element 10, and FIG. 1B illustrates a transmittance distribution of the optical element 10. In FIG. 1B, an abscissa axis represents a position, and an ordinate axis represents a transmittance T.

As illustrated in FIG. 1A, the optical element 10 includes a light transmitting member (first light transmitting member) 1, an optical filter 100, and a light transmitting member (second light transmitting member) 5. The optical filter 100 includes an antireflection layer (first antireflection layer) 2, an absorption layer 3, and an antireflection layer (second antireflection layer) 4 in order from the light transmitting member 1 side (lower side in FIG. 1A). In other words, the optical element 10 includes the light transmitting member 1, the antireflection layer 2 disposed on the light transmitting member 1, the absorption layer 3 disposed on the antireflection layer 2, and the antireflection layer 4 disposed on the absorption layer 3. A light transmitting member 5 is disposed on the antireflection layer 4. Each of the antireflection layers 2 and 4 includes a thin film having one or more layers. Each of the antireflection layers 2 and 4 may have an increased number of layers in order to adjust the refractive index, to expand the antireflection band, to reduce the incident angle dependency, and to reduce the polarization dependency. The absorption layer 3 has one or more layers (absorption films). The antireflection layers 2 and 4 serve to reduce the reflectance of incident light, and the absorption layer 3 has a mechanism for efficiently absorbing the incident light.

As illustrated in FIG. 1B, the optical filter 100 has an area where the transmittance varies according to the film thickness of the absorption layer 3. That the transmittance varies means that the transmittance varies for each position or in the radial direction (from the center to the peripheral portion), but is not limited to this embodiment. The optical filter 100 may have an area where the transmittance continuously changes. A gradation type ND filter can be realized by continuously changing the film thickness of the absorption layer 3. Normally, the reflectance greatly changes according to the film thickness change of the absorption layer 3 when the gradation type ND filter is obtained by changing the film thickness of the absorption layer as illustrated in FIG. 1B, and it is thus difficult to reduce the reflectance in the entire area. However, the optical filter 100 according to this embodiment can maintain low the reflectance in the entire area even when the light is incident from the light transmitting member 5 (upper side in FIG. 1A) or the light transmitting member 1 (lower side in FIG. 1A).

Figure 2:
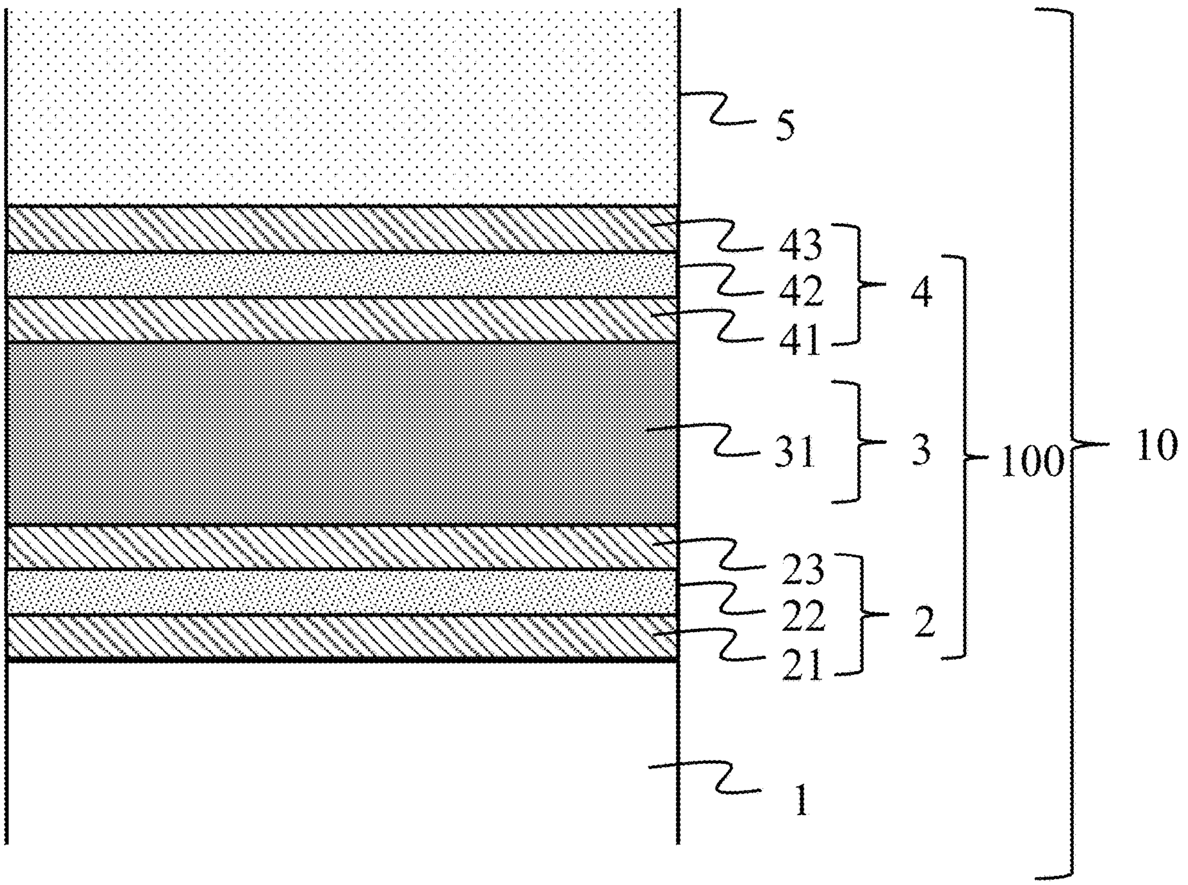
FIG. 2 is a schematic sectional view showing a film configuration at a position where the optical element is located according to this embodiments (Examples 1 to 3).

Referring now to FIG. 2, a description will be given of a film configuration of each layer in the optical element 10. FIG. 2 is a schematic sectional view showing a film configuration at a certain position of the optical element 10. In FIG. 2, for description convenience, the film thickness of the absorption layer 3 is illustrated as being constant.

As illustrated in FIG. 2, the antireflection layer 2 includes thin films 21, 22, and 23 in order from the light transmitting member 1 side. The absorption layer 3 includes a thin film (first film (first area), second film (second area)) 31. The antireflection layer 4 includes thin films 41, 42, and 43 in order from the absorption layer 3 side. In this embodiment, as an example, the antireflection layer 2 has a three-film structure, the absorption layer 3 has a one-film structure, and the antireflection layer 4 has a three-film structure, but the present invention is not limited to this embodiment. In this embodiment, the number of films constituting each of the antireflection layer 2, the absorption layer 3, and the antireflection layer 4 may be one or more. For example, each of the antireflection layers 2 and 4 may have a two-layer configuration.

Figure 3:
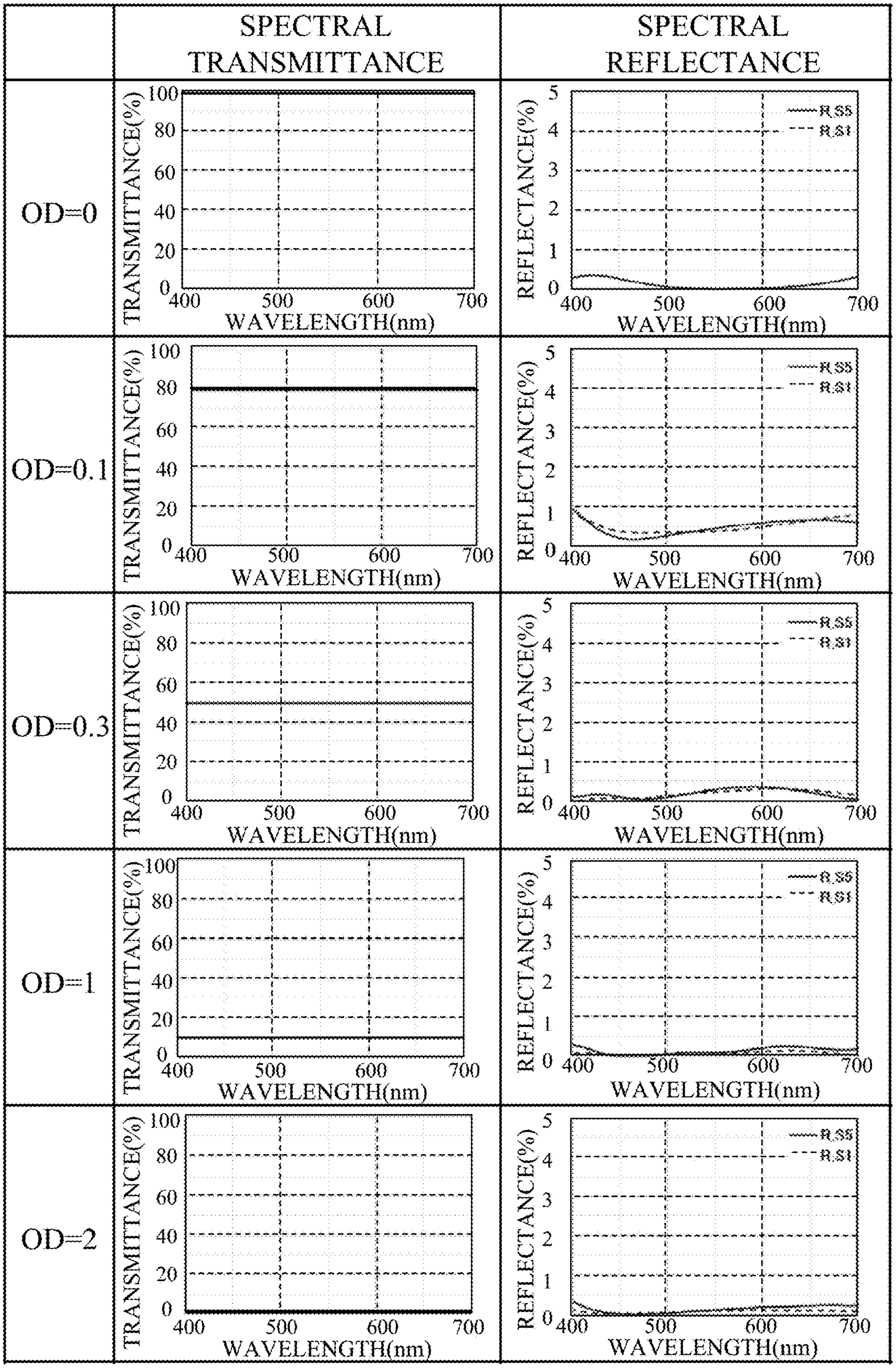
FIG. 3 illustrates a spectral transmittance and a spectral reflectance of the optical element according to this embodiment (Example 1).

Referring now to FIG. 3, a description will be given of a spectral transmittance and a spectral reflectance of the optical element 10. FIG. 3 illustrates a spectral transmittance and a spectral reflectance from 400 nm to 700 nm in areas where the optical density OD is 0, 0.1, 0.3, 1, and 2. In each graph of the spectral transmittance, the abscissa axis represents a wavelength (nm) and the ordinate axis represents a transmittance (%). In each graph of the spectral reflectance, the abscissa axis represents a wavelength (nm) and the ordinate axis represents a reflectance (%). In the following description, the spectral transmittance and the spectral reflectance are characteristics for the vertical incidence of light. The optical density OD is defined as $OD=LOG_{10}(1/T)$ using the transmittance T ($0 \le T \le 1$).

The area where the optical density OD=0 is an area where the film thickness of the absorption layer 3 is 0, and the reflectance R_S5 when light is incident from the light transmitting member 5 side and the reflectance R_S1 when light is incident from the light transmitting member 1 side have the same values. On the other hand, in the area of OD≠0 where the film thickness of the absorption layer 3 with optical density is not 0, the reflectance R_S5 when light is incident from the light transmitting member 5 side and the reflectance R_S1 when light is incident from the light transmitting member 1 side have different values. This is because when the absorption layer 3 exists, the Fresnel coefficient at each interface differs depending on the incident direction.

As illustrated in FIG. 3, the optical filter 100 according to this embodiment realizes a low reflectance from 420 to 680 nm which is a visible light region regardless of the optical density and the incident direction of light. Hereinafter, the reason will be described using an admittance trajectory diagram. The admittance is a value represented by a ratio of the magnetic field strength and the electric field strength in the medium. When the admittance $Y_0$ in the free space is set to a unit, a refractive index of the medium is numerically equivalent to the admittance. Hereinafter, in this specification, the refractive index is treated as the same value as the admittance. The admittance trajectory diagram is a diagram expressing a film characteristic using the concept of an equivalent admittance. The equivalent admittance refers to the admittance of an equivalent substrate when the entire system in which a thin film is added to the substrate is replaced with a single substrate having an equivalent characteristic.

Figure 4A:
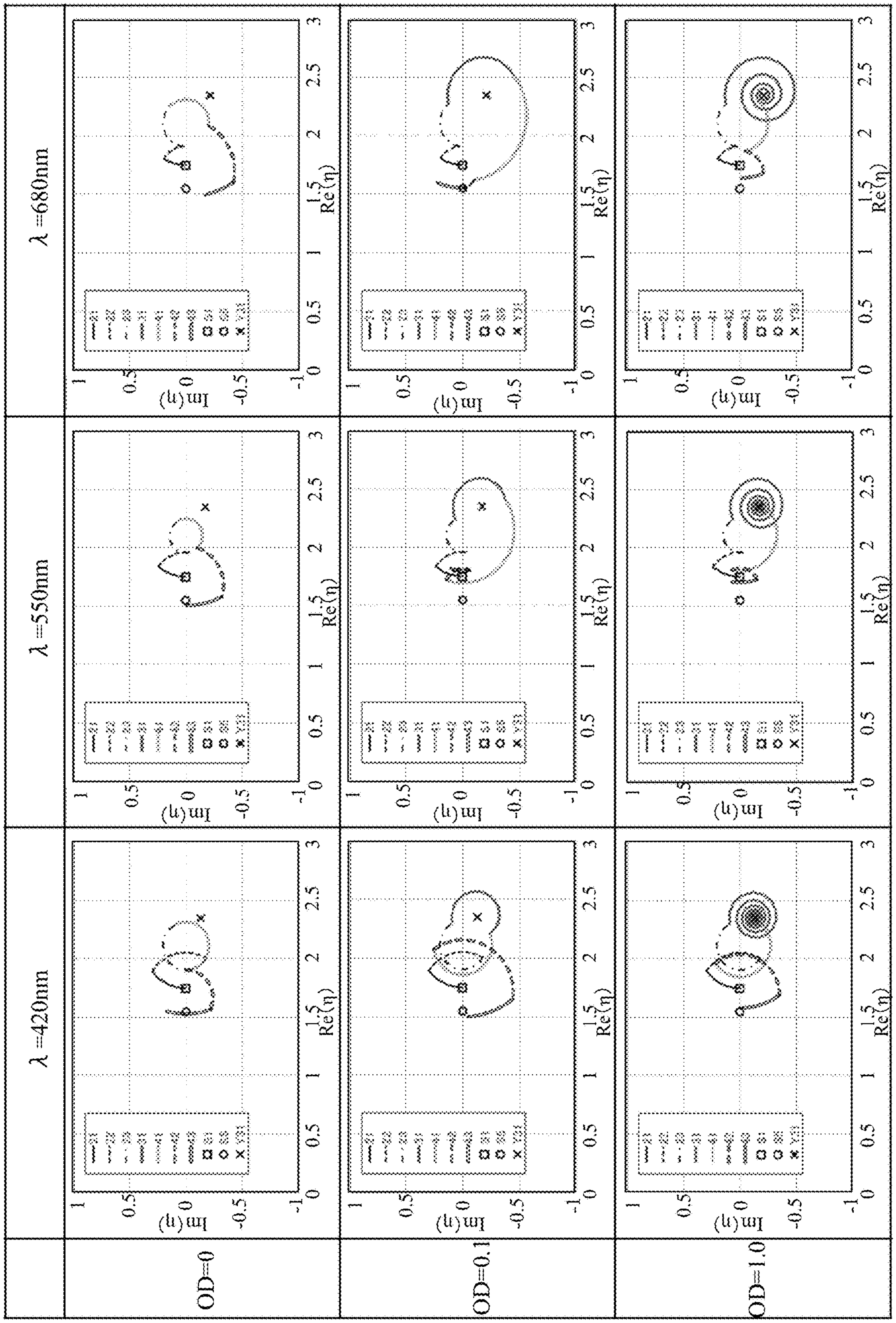
FIGS. 4A and 4B are equivalent admittance trajectory diagrams of the optical element according to this embodiment.
Figure 4B:
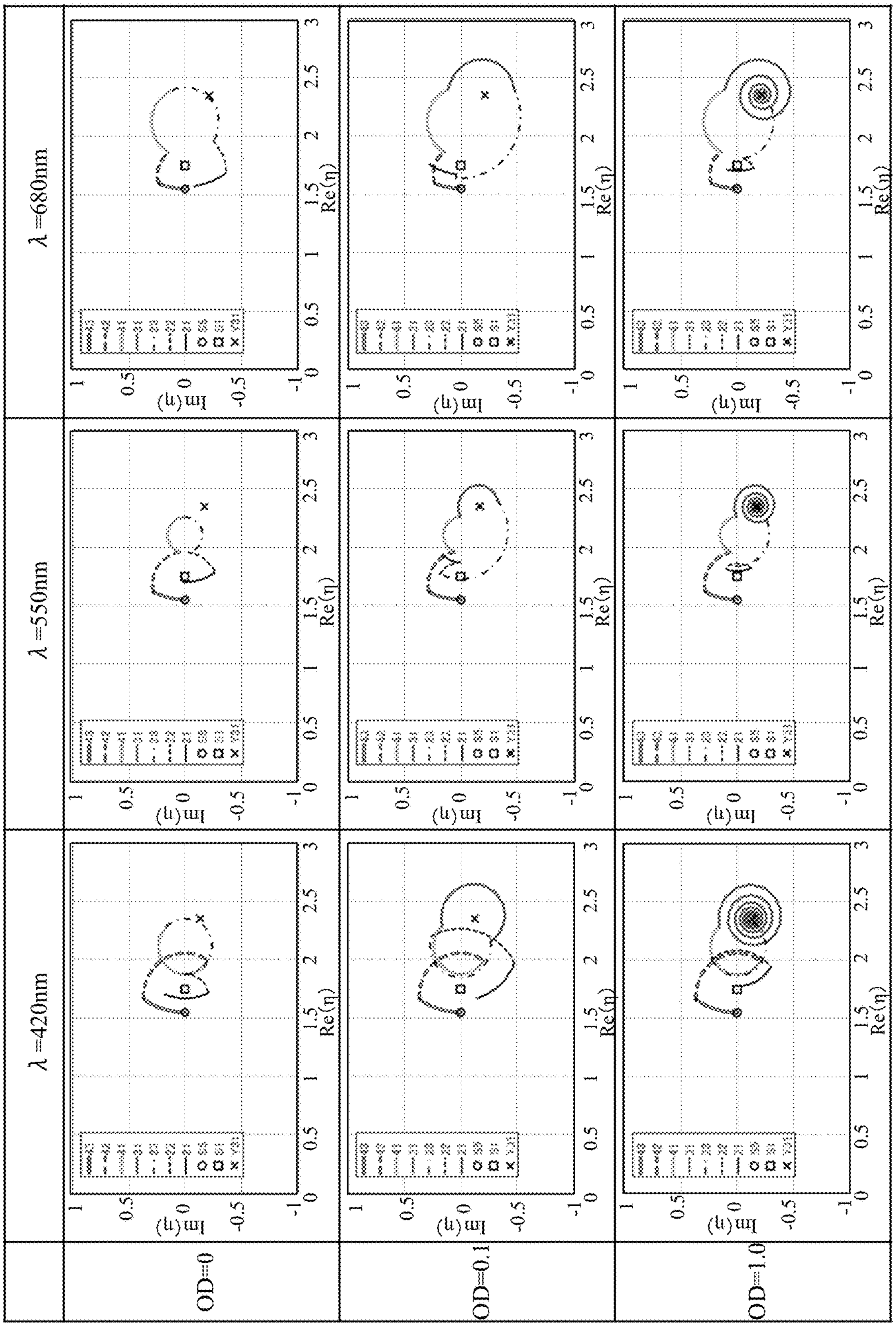

FIGS. 4A and 4B are admittance trajectory diagrams of the optical filter 100 where the ordinate axis represents the optical density OD=0, 0.1, and 1.0, and the abscissa axis represents the visible area wavelengths of 420 nm, 550 nm, and 680 nm. FIG. 4A illustrates the equivalent admittance for light incidence from the light transmitting member 5 side, and FIG. 4B illustrates the equivalent admittance for light incidence from the light transmitting member 1 side.

Initially, the way of reading the figure will be described with reference to the admittance trajectory diagram during the light incidence from the light transmitting member 5 side in FIG. 4A as an example. In each graph in FIGS. 4A and 4B, the abscissa axis represents a real part Re ($\eta$) of the admittance $\eta$, and the ordinate axis represents an imaginary part Im ($\eta$) of the admittance. In the figure, a square mark represents the admittance of the light transmitting member 1, a circle mark represents the admittance of the light transmitting member 5, and a cross mark represents the admittance of the thin film 31. There is no absorption in the light transmitting members 1 and 5. Where $n_{S1}$ is a refractive index of the light transmitting member 1, the light transmitting member 1 has the admittance $\eta_{s1}=n_{S1}Y_0$, but this specification sets the admittance $Y_0$ in a free space to a unit of the admittance and thus numerically $\eta_{s1}$ and $n_{S1}$ are equal to each other. On the other hand, the thin film 31 is an absorption film having an absorption. When there is absorption, a complex refractive index is n−ik and the admittance then is $(n-ik)Y_0$. Herein, k is an extinction coefficient. Even in this case, the admittance and the complex refractive index are numerically equal to each other when the admittance $Y_0$ in the free space is set to the unit of the admittance.

As illustrated in FIG. 2, the optical filter 100 according to this embodiment includes the antireflection layer 2, the absorption layer 3, the antireflection layer 4, and a light transmitting member S5 in order from the light transmitting member 1 side. As illustrated in FIG. 2, the antireflection layer 2 has thin films 21, 22, and 23, the absorption layer 3 has a thin film 31, and the antireflection layer 4 has thin films 41, 42, and 43. The antireflection layer 2 serves to reduce the reflection at the interface between the light transmitting member 1 and the absorption layer 3. The antireflection layer 4 serves to reduce a reflection at the interface between the absorption layer 3 and the light transmitting member 5.

FIG. 4A illustrates an equivalent admittance trajectory from the light transmitting member 1 to the thin films 21, 22, 23, 31, 41, 42, and 43. The Fresnel coefficient and the reflectance can be calculated by the equivalent admittance from the light transmitting member 1 to the thin film 43 and the admittance of the light transmitting member 5. When the equivalent admittance from the light transmitting member 1 to the thin film 43 is equal to the admittance of the light transmitting member 5, the reflectance is zero. On the other hand, FIG. 4B illustrates an equivalent admittance trajectory from the light transmitting member 5 to the thin films 43, 42, 41, 31, 23, 22, 21. Even in this case, the reflectance is 0 when the equivalent admittance from the light transmitting member 5 to the thin film 21 is equal to the admittance of the light transmitting member 1.

The first column in FIGS. 4A and 4B represents the equivalent admittance for the wavelength λ=420 nm, the second column represents the equivalent admittance for the wavelength λ=550 nm, and the third column represents the equivalent admittance for the wavelength λ=680 nm. Since the equivalent admittance is a function of the wavelength λ, even if the optical density OD is the same, the equivalent admittance changes depending on the use wavelength.

The first row in FIGS. 4A and 4B illustrates the equivalent admittance for the optical density OD=0, the second row illustrates the equivalent admittance for the optical density OD=0.1, and the third row illustrates the equivalent admittance for the optical density OD=1. In FIG. 4A, the optical admittance trajectory from the light transmitting member 1 to the thin film 23 is the same for each wavelength even if the optical density is different. Since the film thickness of the absorption layer 3 varies depending on the optical density OD, the equivalent admittance trajectory after the absorption layer 3 changes. This is similarly applied to FIG. 4B. OD=0 at the first stage in FIGS. 4A and 4B corresponds to the film thickness of 0 of the absorption layer 3, and there is no change in equivalent admittance due to the absorption layer 3. For OD=0.1 at the second stage and OD=1.0 at the third stage in FIGS. 4A and 4B, the thickness of the absorption layer 3 increases, so the admittance trajectory changes as illustrated. When the absorption layer 3 is sufficiently thick, as illustrated at the third stage in FIGS. 4A and 4B, and the light is incident from the light transmitting member 5 side, the equivalent admittance from the light transmitting member 1 to the thin film 31 approaches to a cross mark that is the admittance of the thin film 31 and can be considered substantially equal to the admittance of the thin film 31. Similarly, when the light is incident from the light transmitting member 1 side, the equivalent admittance from the light transmitting member 5 to the absorption layer 3 can be considered substantially equal to the admittance of the thin film 31.

As described above, the equivalent admittance of the gradation type ND filter changes depending on the use wavelength and the optical density. However, in order to make the reflectance close to 0, the equivalent admittance from the light transmitting member 1 to the thin film 43 needs to be made closer to the admittance of the light transmitting member 5 and the equivalent admittance from the light transmitting member 5 to the thin film 21 needs to be closer to the admittance of the light transmitting member 1 regardless of the wavelength and the optical OD. Therefore, the optical filter 100 may have a film configuration in which the equivalent admittance is less likely to change even when the wavelength or optical OD changes.

First, in order to obtain the film configuration in which the equivalent admittance is less likely to change even when the optical OD changes, each of the equivalent admittance from the light transmitting member 1 to the thin film 23 and the equivalent admittance from the light transmitting member 5 to the thin film 41 may be made closer to the admittance of the thin film 31, so as to make as small as possible the change in equivalent admittance due to the change in the film thickness of the absorption layer 3.

According to the admittance trajectory diagram, when a non-absorbing substrate and film material are used, the m-th layer admittance trajectory in the m-layer multilayer film (m-th layer refractive index: $N_m$) on the substrate (refractive index: $N_{sub}$) passes a circular trajectory that has a center at $O_m((N_m^2+Y_{m-1}^2)/2Y_{m-1}, 0)$. In other words, the trajectory starts from the refractive index ($N_{sub}$, 0) of the substrate, and is made by connecting arcs of circles that have the center $O_m$. As described above, since the optical admittance is a function of the wavelength, the length of the arc varies depending on the wavelength. In order to suppress the length change of the arc due to the wavelength, a trajectory that reduces the diameter of the circle may be selected.

As understood from FIG. 4A, when the light is incident from the light transmitting member 5, if the center of the circular trajectory in the thin film 23 in the equivalent admittance from the light transmitting member 1 to the thin film 23 is close to the admittance of the thin film 31, the diameter of the circle can be made smaller. In other words, $((N_{23}^2+Y_{22}^2)/2Y_{22}, 0)$ may be close to $(N_{31}, k_{31})$, where $Y_{22}$ is the equivalent admittance from the light transmitting member 1 to the thin film 22, $N_{23}$ is the admittance (refractive index) of the thin film 23, and $N_{31}$ is the admittance (real part of the complex refractive index) of the thin film 31. In order to satisfy this condition, the following conditional expression (1) needs to be satisfied, where $n_1$ is a refractive index of the thin film (third film or third area) 23 adjacent to the absorption layer 3, and $n_A$ is a refractive index of the thin film (first film or first area) 31 constituting the absorption layer 3 adjacent to the thin film 23.

$$|n_A-n_1|\leq 0.45 \tag{1}$$

The following conditional expression (1a) may be satisfied.

$$|n_A-n_1|\leq 0.40 \tag{1a}$$

Alternatively, the following conditional expression (1b) may be satisfied.

$$|n_A-n_1|\leq 0.35 \tag{1b}$$

Similarly, as understood from FIG. 4B, when the light is incident from the light transmitting member 1 and the center of the circular trajectory in the thin film 41 in the equivalent admittance from the light transmitting member 5 to the thin film 41 is close to the admittance of the thin film 31, the diameter of the circle can be made smaller. Therefore, the following conditional expression (2) needs to be satisfied, where $n_2$ is a refractive index of the thin film (fourth film or fourth area) 41 adjacent to the absorption layer 3, and $n_B$ is a refractive index of the thin film (second film or second area) 31 constituting the absorption layer 3 adjacent to the thin film 41.

$$|n_B-n_2|\leq 0.45 \quad (2)$$

The following conditional expression (2a) may be satisfied.

$$|n_B-n_2|\leq 0.40 \quad (2a)$$

Alternatively, the following conditional expression (2b) is satisfied.

$$|n_B-n_2|\leq 0.35 \quad (2b)$$

As described above, the conditional expressions (1) and (2) may be satisfied in order to provide a film configuration in which the equivalent admittance is less likely to change even when the wavelength or the optical OD changes regardless of whether the light is incident from the light transmitting member 5 or the light transmitting member 1.

In the above description, since the absorption layer 3 has a single layer configuration, $n_A=n_B$ is met or the first film (first area) and the second film (second area) are a common film. The conditional expressions (1) and (2) needs to be satisfied, where $n_A$ is the refractive index of the film (first film, first area) adjacent to the antireflection layer 2 in the absorption layer 3 and $n_B$ is the refractive index of the film (second film, second area) adjacent to the antireflection layer 4 in the absorption layer 3, when absorption layer 3 has two or more layers.

This embodiment may satisfy the following conditional expression (3), where $N_s$ is a refractive index of the light transmitting member 1 and $N_g$ is a refractive index of the light transmitting member 5. If the conditional expression (3) is not satisfied, the design of the optical element 10 becomes difficult.

$$|N_s-N_g|\leq 0.45 \quad (3)$$

The following conditional expression (3a) may be satisfied.

$$|N_s-N_g|\leq 0.40 \quad (3a)$$

This embodiment may satisfy the conditional expressions $N_s>1.40$ and $N_g>1.40$.

The number of films constituting the antireflection layer 2 and the number of films constituting the antireflection layer 4 may be equal to each other. This is because the same number of films constituting each antireflection layer can provide a well balance by providing almost equal antireflection effects between a case where the light is incident from the light transmitting member 5 and a case where light is incident from the light transmitting member 1. Each of the number of films constituting the antireflection layer 2 and the number of films constituting the antireflection layer 4 is two or more. This is because when the number of films constituting each antireflection layer is small, the antireflection effect lowers.

In producing the optical filter 100 according to this embodiment, the light transmitting members 1 and 5 may be made of any materials as long as they are transparent in the visible range. At this time, one of the light transmitting members 1 and 5 may be a light transmitting member such as glass or plastic. The other may be air or an adhesive used to form a cemented lens. When the light transmitting member is glass or plastic, the shape of the surface may be a flat surface, a convex surface (convex lens), a concave surface (concave lens), or a curved surface. Moreover, the light transmitting member including an adhesive may use an epoxy adhesive, a polyene polythiol adhesive, or an acrylic adhesive. In particular, the light transmitting member including an adhesive may use a UV-curable polyene polythiol-based adhesive, due to it has a stepwise reaction and a short processing tact.

The method of forming the absorption layer 3 having a film thickness distribution includes a vapor deposition and sputtering. The absorption layer 3 having an arbitrary transmittance distribution can be formed by using a mask having an arbitrary shape during the vapor deposition or sputtering. A wet processing method such as a plating method or spin coating may be used.

An extinction coefficient k of the material of the absorption layer 3 may satisfy the following conditional expression (4).

$$0.05\leq k\leq 0.35 \quad (4)$$

When the conditional expression (4) is not satisfied, it is difficult to realize a low reflectance regardless of the optical density (the thickness of the absorption layer 3). Examples of the material that satisfies the conditional expression (4) include an oxygen deficient type, such as $TiO_2$, $Nb_2O_5$, and $Ta_2O_5$. In order to obtain the wavelength flatness of the spectral transmittance of the ND filter, materials having positive and negative chromatic dispersions of the extinction coefficient k in the used wavelength band may be combined.

The extinction coefficient k may satisfy the following conditional expression (4a).

$$0.05\leq k\leq 0.30 \quad (4a)$$

Alternatively, the extinction coefficient k may satisfy the following conditional expression (4b).

$$0.10\leq k\leq 0.25 \quad (4b)$$

Figure 20A:
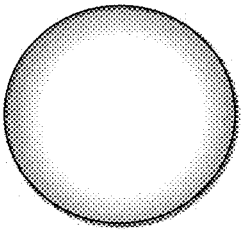
FIGS. 20A to 20D illustrate illustrative transmittance distributions according to this embodiment.
Figure 20B:
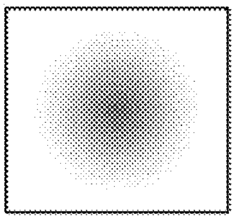
Figure 20C:
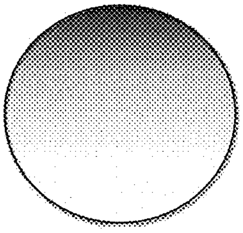
Figure 20D:
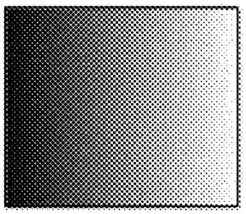

Various shapes can be used for the transmittance distribution of the gradation type ND filter. FIGS. 20A-20D illustrate illustrative transmittance distributions. For example, as illustrated in FIGS. 20A and 20B, a transmittance distribution can be formed in the concentric direction. Alternatively, as illustrated in FIGS. 20C and 20D, the transmittance may change in one direction. In addition to the above, there are a variety of transmittance distribution shapes depending on applications, but the configuration according to this embodiment is applicable to any transmittance distribution shape. Specific examples will be described below. However, these are merely embodiments, and the present invention is not limited to these conditions.

Example 1

Referring now to FIGS. 1A, 1B, 3, 5, and 6, a description will be given of an optical element according to Example 1 of the present invention. In the optical element according to this example, a gradation type ND filter (optical filter), in which the transmittance gradually decreases from the center (optical axis) to the peripheral portion on the optical plane, is sandwiched between the light transmitting members 1 and 5, similar to the optical element 10 described with reference to FIGS. 1A, 1B and 2. Table 1 shows a film configuration of the optical filter according to this example.

In this embodiment, a glass material S1 is used as the light transmitting member 1, and an adhesive S5 is used as the light transmitting member 5. The glass material S1 and the adhesive S5 are made of non-absorbing materials (non-absorption layers). In this embodiment, each of the antireflection layers 2 and 4 includes alternating layers of the film materials M1 and H1. The film materials M1 and H1 are also made of non-absorbing materials. In this embodiment, the absorption layer 3 is made of the absorbing material A1.

Figure 5:
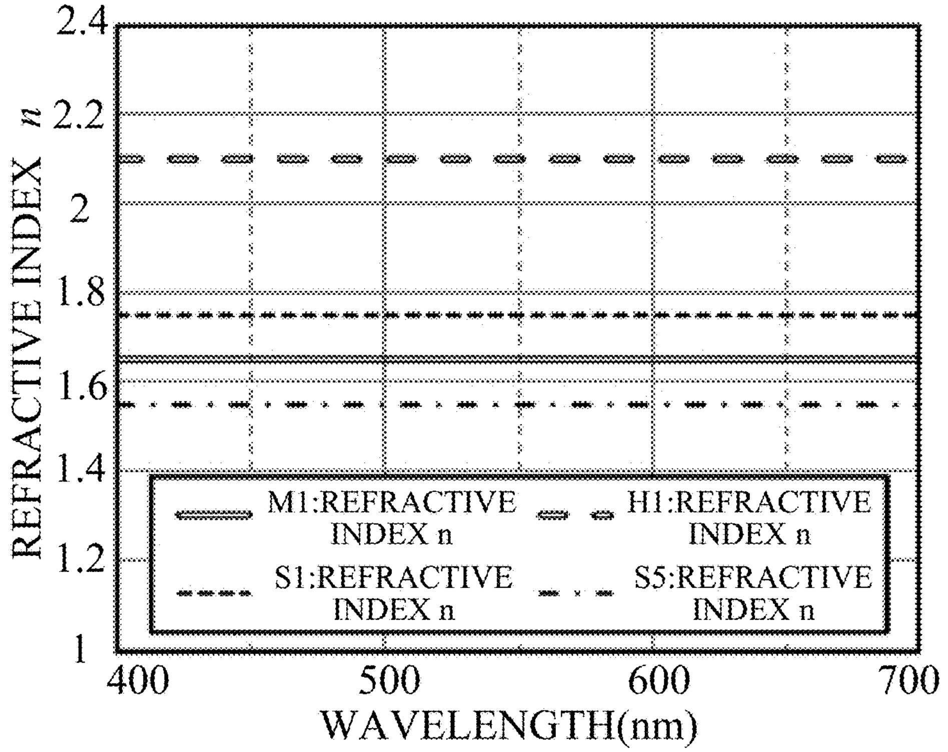
FIG. 5 illustrates a refractive index of each material in the optical element according to Examples 1 and 4.
Figure 6:
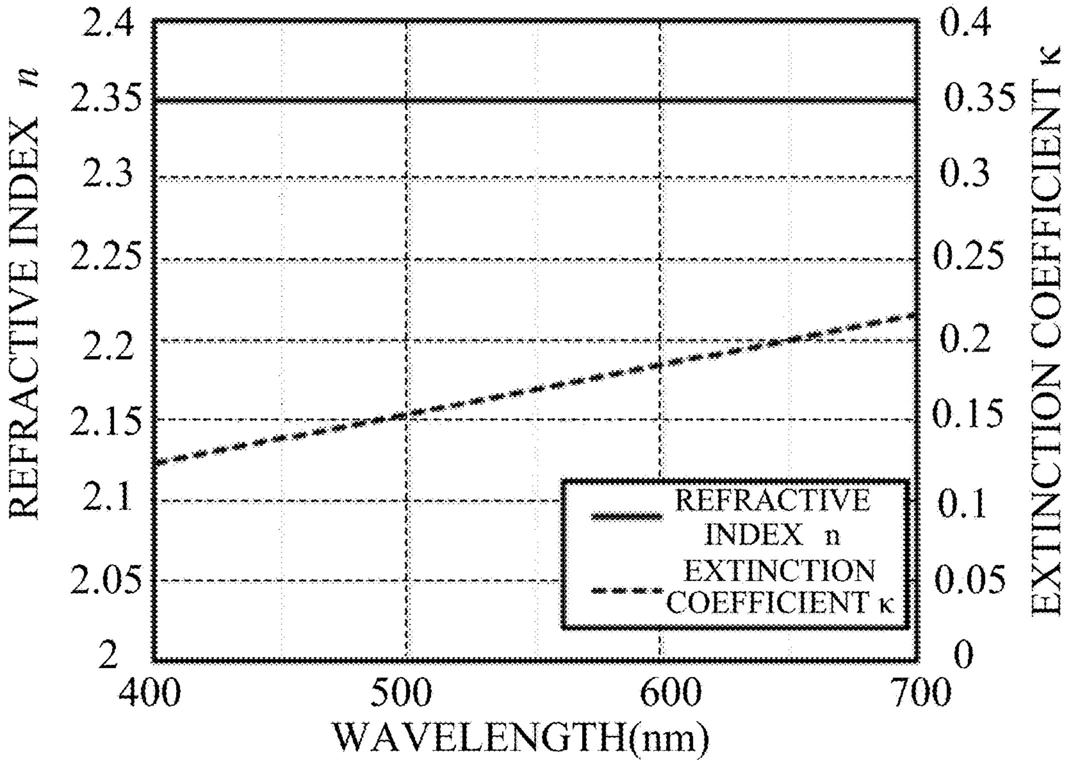
FIG. 6 illustrates a refractive index and an extinction coefficient of an absorption layer in the optical element according to Example 1.

FIG. 5 illustrates the refractive indices of the materials (glass material S1, adhesive S5, film materials M1 and H1) constituting the optical element according to this example. In FIG. 5, the abscissa axis represents a wavelength (nm) and the ordinate axis represents a refractive index n. FIG. 6 illustrates the refractive index n and the extinction coefficient k of the absorption layer 3 (absorbing material A1). In FIG. 6, the abscissa axis represents a wavelength (nm), and the ordinate axes represent a refractive index n and an extinction coefficient k. In FIG. 6, a solid line represents the refractive index n, and a broken line represents the extinction coefficient k. In the wavelength range of 400 to 700 nm, $0.12 \leq k \leq 0.22$ is met.

The optical element (optical filter) according to this example has the spectral transmittance and the spectral reflectance illustrated in FIG. 3. In FIG. 3, R_S5 represents the spectral reflectance when the light is incident from the light transmitting member 5 (adhesive S5) side, and R_S1 represents the spectral reflectance when the light is incident from the light transmitting member 1 (glass material S1) side. Since the optical element according to this example satisfies the conditional expression (2), both the spectral reflectance R_S5 and the spectral reflectance R_S1 realize a low reflectance.

TABLE 1

| | | material | refractive index (λ = 550 nm) | physical film thickness(nm) |
|---|---|---|---|---|
| transparent material 5 | adhesive | S5 | 1.55 | — |
| antireflection layer 4 | thin film 43 | H1 | 2.1 | 12.5 |
| | thin film 42 | M1 | 1.65 | 38.6 |
| | thin film 41 | H1 | 2.1 | 57.2 |
| absorption layer 3 | thin film 31 | A1 | 2.35 | 0~1000 |
| antireflection layer 2 | thin film 23 | H1 | 2.1 | 61.4 |
| | thin film 22 | M1 | 1.65 | 24.7 |
| | thin film 21 | H1 | 2.1 | 16.6 |
| transparent material 1 | glass material | S1 | 1.75 | — |

Example 2

Figure 7:
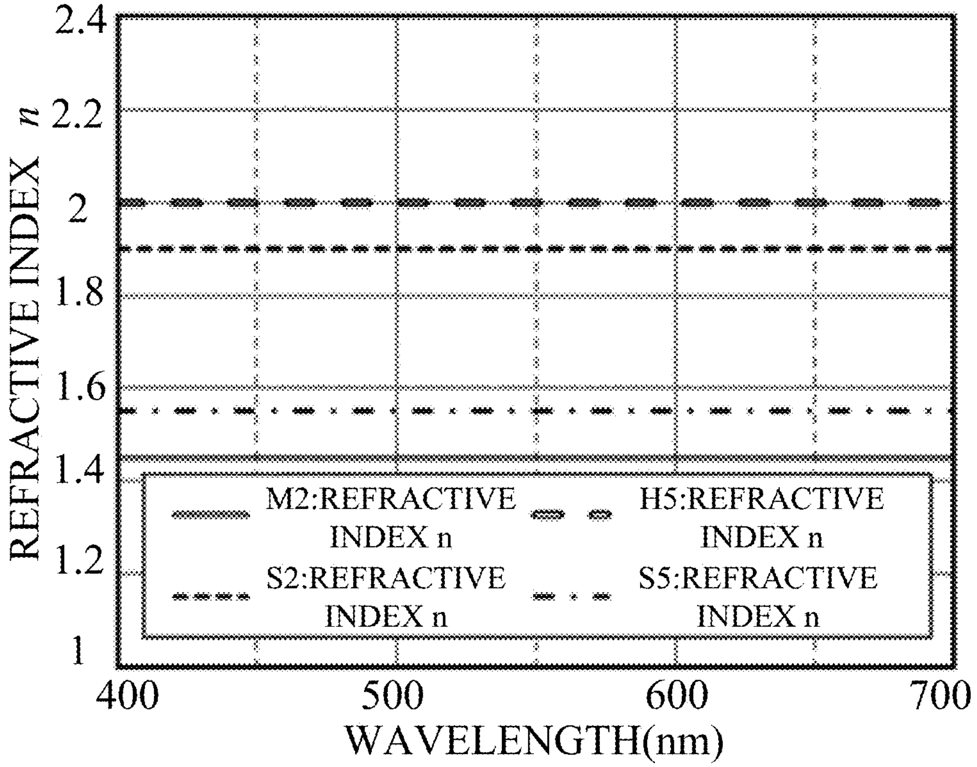
FIG. 7 illustrates a refractive index of each material in the optical element according to Examples 2 and 5.
Figure 8:
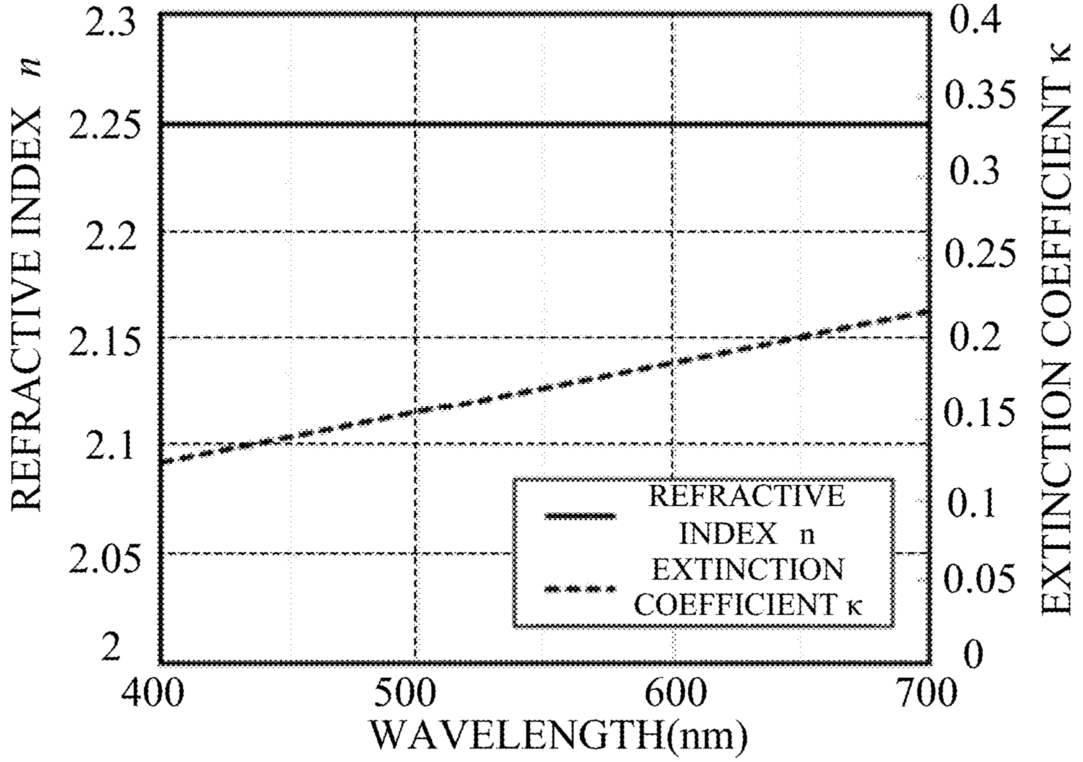
FIG. 8 illustrates a refractive index and an extinction coefficient of the absorption layer in the optical element according to Example 2.
Figure 9:
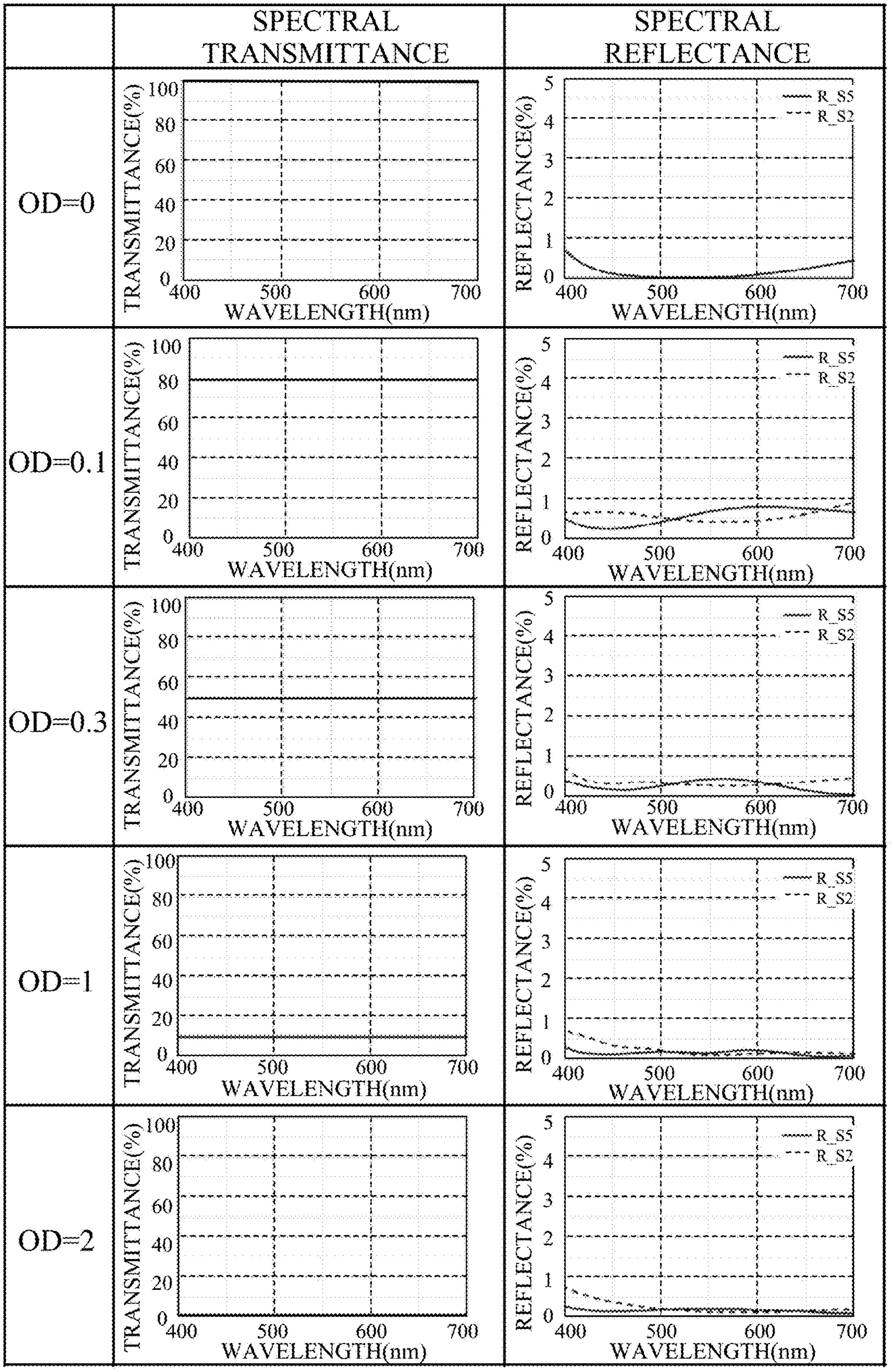
FIG. 9 illustrates a spectral transmittance and a spectral reflectance of the optical element according to Example 2.

Referring now to FIGS. 7 to 9, a description will be given of an optical element according to Example 2 of the present invention. In the optical element of this embodiment, a gradation type ND filter (optical filter), in which the transmittance gradually decreases from the center (optical axis) to the peripheral portion on the optical plane, is sandwiched between the light transmitting members 1 and 5, similar to the optical element 10 described with reference to FIGS. 1A, 1B, and 2. Table 2 shows a film configuration of the optical filter according to this example.

In this embodiment, a glass material S2 is used as the light transmitting member 1, and an adhesive S5 is used as the light transmitting member 5. The glass material S2 and the adhesive S5 are made of non-absorbing materials (non-absorption layers). In this embodiment, each of the antireflection layers 2 and 4 includes alternating layers of the film materials M2 and H2. The film materials M2 and H2 are also made of non-absorbing materials. In this embodiment, the absorption layer 3 is made of the absorbing material A2.

FIG. 7 illustrates the refractive indices of the materials (glass material S2, adhesive S5, film materials M2 and H2) constituting the optical element according to this example. In FIG. 7, the abscissa axis represents a wavelength (nm) and the ordinate axis represents a refractive index n. FIG. 8 illustrates the refractive index n and the extinction coefficient k of the absorption layer 3 (absorbing material A2). In FIG. 8, the abscissa axis represents a wavelength (nm), and the ordinate axes represents a refractive index n and an extinction coefficient k. In FIG. 8, a solid line represents the refractive index n, and a broken line represents the extinction coefficient k. In the wavelength range of 400 to 700 nm, $0.12 \leq k \leq 0.22$ is met.

FIG. 9 illustrates the spectral transmittance and the spectral reflectance of the optical element (optical filter) according to this example. In FIG. 9, R_S5 represents the spectral reflectance when the light is incident from the light transmitting member 5 (adhesive S5) side, and R_S2 represents the spectral reflectance when the light is incident from the light transmitting member 1 (glass material S2) side. Since the optical element according to this example satisfies the conditional expression (2), both the spectral reflectance R_S5 and the spectral reflectance R_S2 realize a low reflectance.

TABLE 2

| | | material | refractive index (λ = 550 nm) | physical film thickness(nm) |
|---|---|---|---|---|
| transparent material 5 | adhesive | S5 | 1.55 | — |
| antireflection layer 4 | thin film 43 | H2 | 2.0 | 8.0 |
| | thin film 42 | M2 | 1.45 | 50.6 |
| | thin film 41 | H2 | 2.0 | 66.9 |
| absorption layer 3 | thin film 31 | A2 | 2.25 | 0~1000 |
| antireflection layer 2 | thin film 23 | H2 | 2.0 | 81.7 |
| | thin film 22 | M2 | 1.45 | 14.9 |
| | thin film 21 | H2 | 2.0 | 8.0 |
| transparent material 1 | glass material | S2 | 1.9 | |

Example 3

Figure 10:
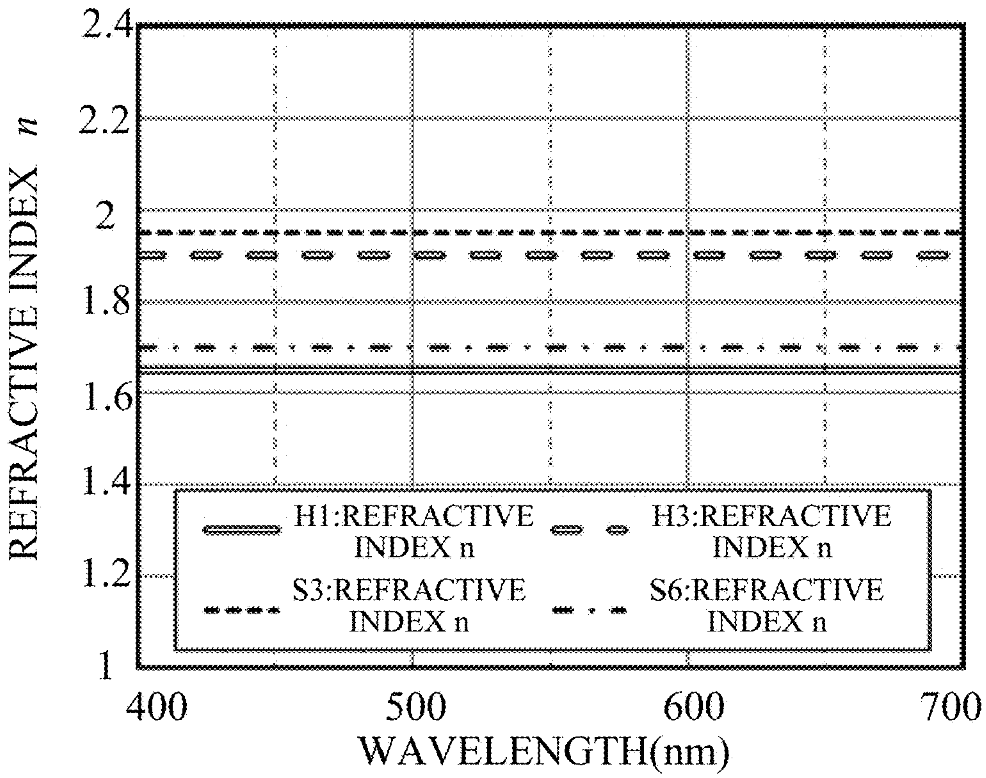
FIG. 10 illustrates a refractive index of each material in the optical element according to Example 3.
Figure 11:
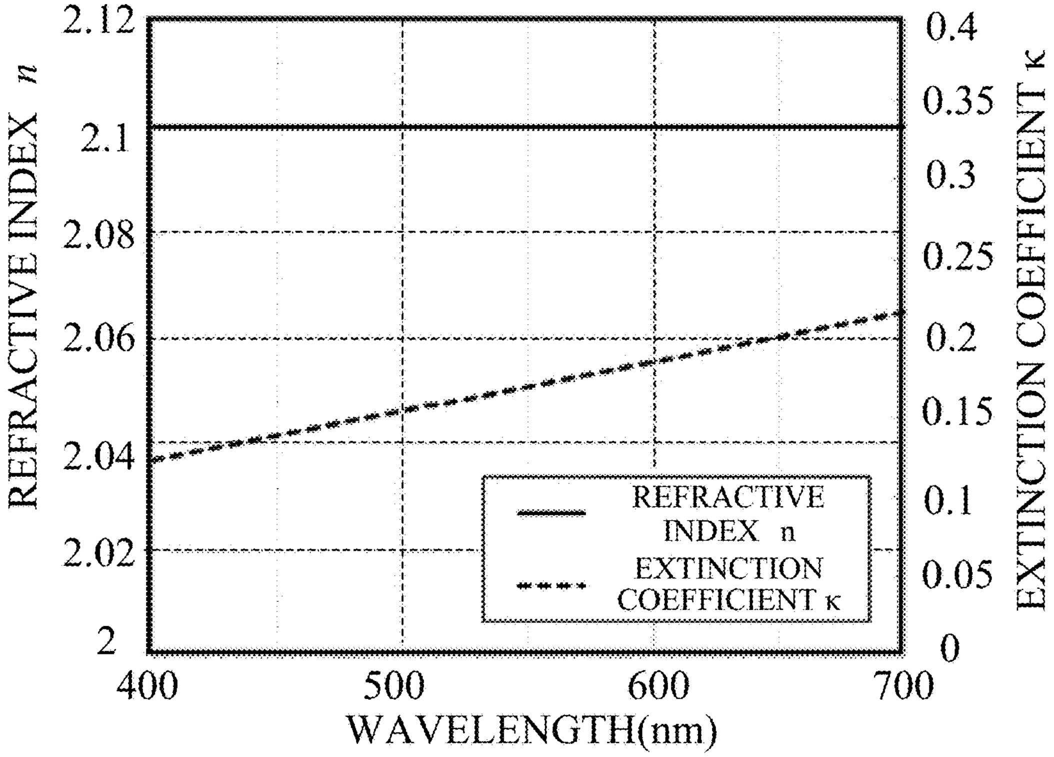
FIG. 11 illustrates a refractive index and an extinction coefficient of the absorption layer in the optical element according to Example 3.
Figure 12:
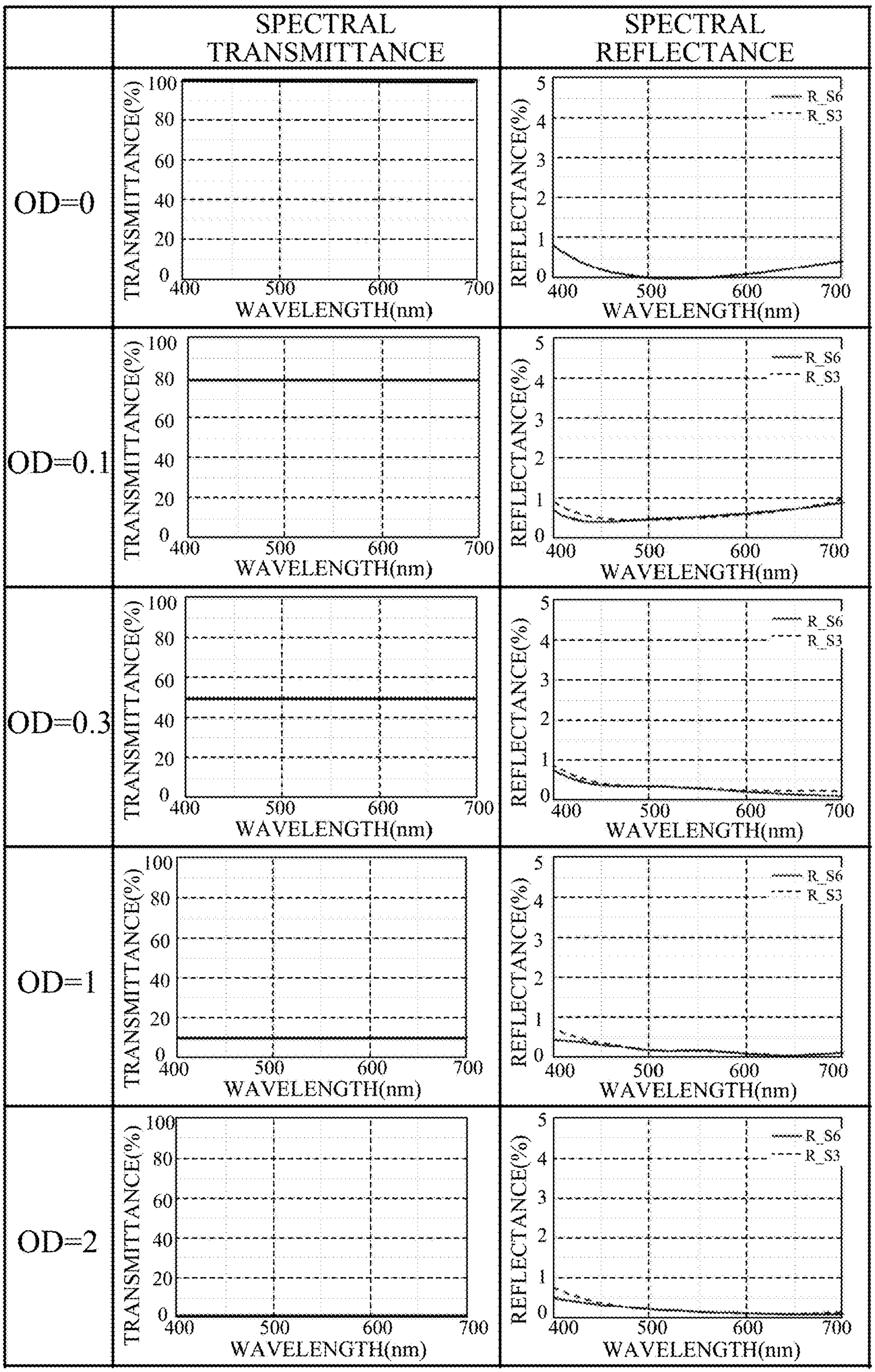
FIG. 12 illustrates a spectral transmittance and a spectral reflectance of the optical element according to Example 3.

Referring now to FIGS. 10 to 12, a description will be given of an optical element according to Example 3 of the present invention. In the optical element of this embodiment, A gradation type ND filter (optical filter), in which the transmittance gradually decreases from the center (optical axis) to the peripheral portion on the optical plane, is sandwiched between the light transmitting members 1 and 5, similar to the optical element 10 described with reference to FIGS. 1A, 1B, and 2. Table 3 shows a film configuration of the optical filter according to this example.

In this embodiment, a glass material S3 is used as the light transmitting member 1, and an adhesive S6 is used as the light transmitting member 5. The glass material S3 and the adhesive S6 are made of non-absorbing materials (non-absorption layers). In this embodiment, each of the antireflection layers 2 and 4 includes alternating layers of the film materials M1 and H3. The film materials M1 and H3 are also made of non-absorbing materials. In this embodiment, the absorption layer 3 is made of the absorption material A3.

FIG. 10 illustrates the refractive indices of the materials (glass material S3, adhesive S6, film materials M1 and H3) constituting the optical element according to this example. In FIG. 10, the abscissa axis represents a wavelength (nm) and the ordinate axis represents a refractive index n. FIG. 11 illustrates the refractive index n and the extinction coefficient k of the absorption layer 3 (absorbing material A3). In FIG. 11, the abscissa axis represents a wavelength (nm), and the ordinate axes represent a refractive index n and an extinction coefficient k. In FIG. 11, a solid line represents the refractive index n, and a broken line represents the extinction coefficient k. In the wavelength range of 400 to 700 nm, $0.12 \le k \le 0.22$ is met.

FIG. 12 illustrates the spectral transmittance and the spectral reflectance of the optical element (optical filter) according to this example. In FIG. 12, R_S6 represents the spectral reflectance when the light is incident from the light transmitting member 5 (adhesive S6) side, and R_S3 represents the spectral reflectance when the light is incident from the light transmitting member 1 (glass material S3) side. Since the optical element according to this example satisfies the conditional expression (2), both the spectral reflectance R_S6 and the spectral reflectance R_S3 realize a low reflectance.

TABLE 3

| | | material | refractive index (λ = 550 nm) | physical film thickness(nm) |
|---|---|---|---|---|
| transparent material 5 | adhesive | S6 | 1.70 | — |
| antireflection layer 4 | thin film 43 | H3 | 1.9 | 8.3 |
| | thin film 42 | M1 | 1.65 | 30.8 |
| | thin film 41 | H3 | 1.9 | 75.0 |
| absorption layers 3 | thin film 31 | A3 | 2.1 | 0~1000 |
| antireflection layer 2 | thin film 23 | H3 | 1.9 | 92.0 |
| | thin film 22 | M1 | 1.65 | 19.1 |
| | thin film 21 | H3 | 1.9 | 83.8 |
| transparent material 1 | glass material | S3 | 1.95 | — |

Example 4

Referring now to FIGS. 1A, 1B, 5, and 13 to 15, a description will be given of an optical element according to Example 4 of the present invention. In the optical element according to this example, a gradation type ND filter (optical filter), in which the transmittance gradually decreases from the center (optical axis) to the peripheral portion on the optical plane, is sandwiched between the light transmitting members 1 and 5, similar to the optical element 10 described with reference to FIGS. 1A and 1B.

Figure 13:
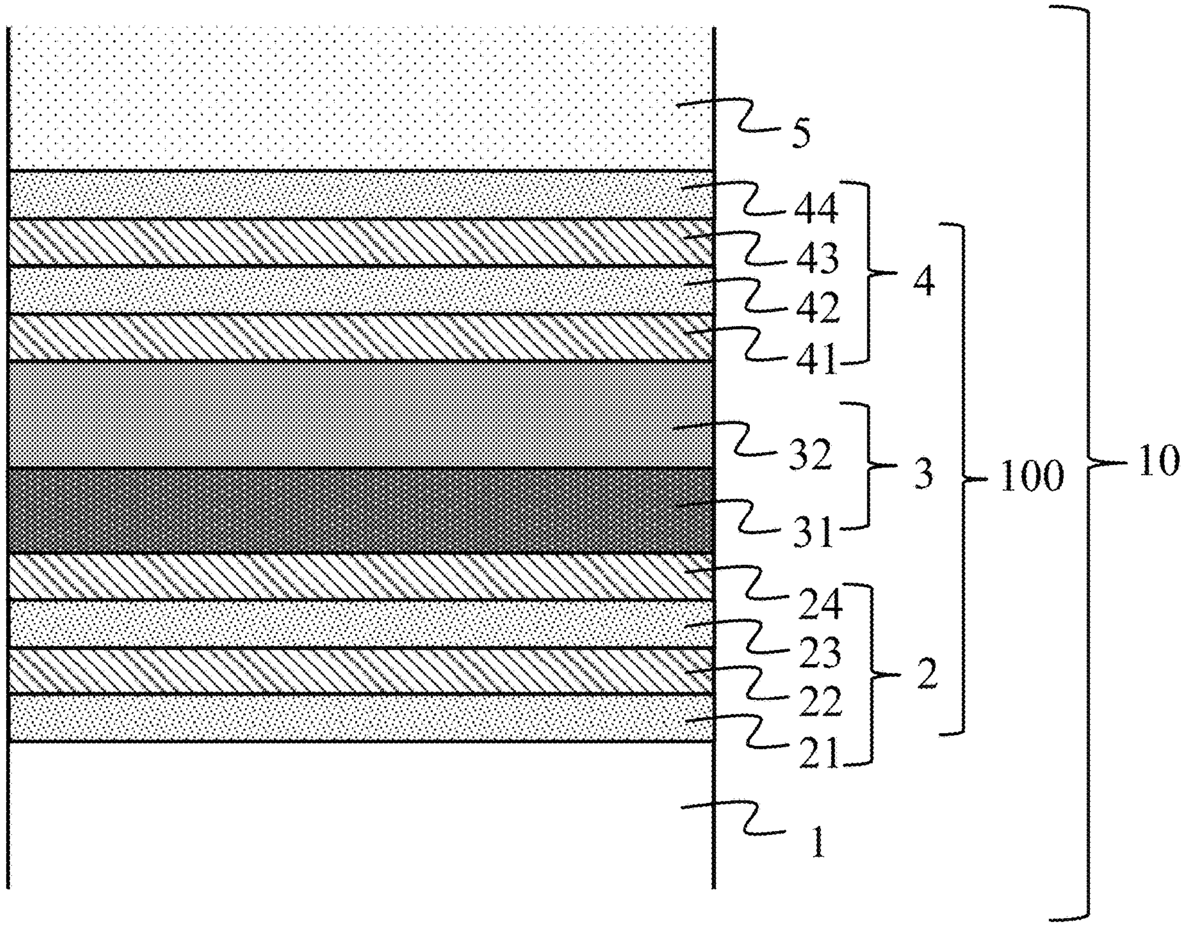
FIG. 13 is a schematic sectional view showing a film configuration at a position where an optical element according to Examples 4 to 6 is located.

FIG. 13 is a schematic sectional view showing a film configuration at a position where the optical element according to this example is located. In FIG. 13, for description convenience, the film thickness of the absorption layer 3 is shown as being constant. As illustrated in FIG. 13, the antireflection layer 2 includes thin films 21, 22, 23, and 24 in order from the light transmitting member 1 side. The absorption layer 3 includes a thin film (first film or first area) 31 and a thin film (second film or second area) 32 in order from a position adjacent to the thin film (third film or third area) 24. The antireflection layer 4 includes thin films 41, 42, 43, and 44 in order from the absorption layer 3 side. Table 4 illustrates a film configuration of the optical filter according to this example.

Figure 14:
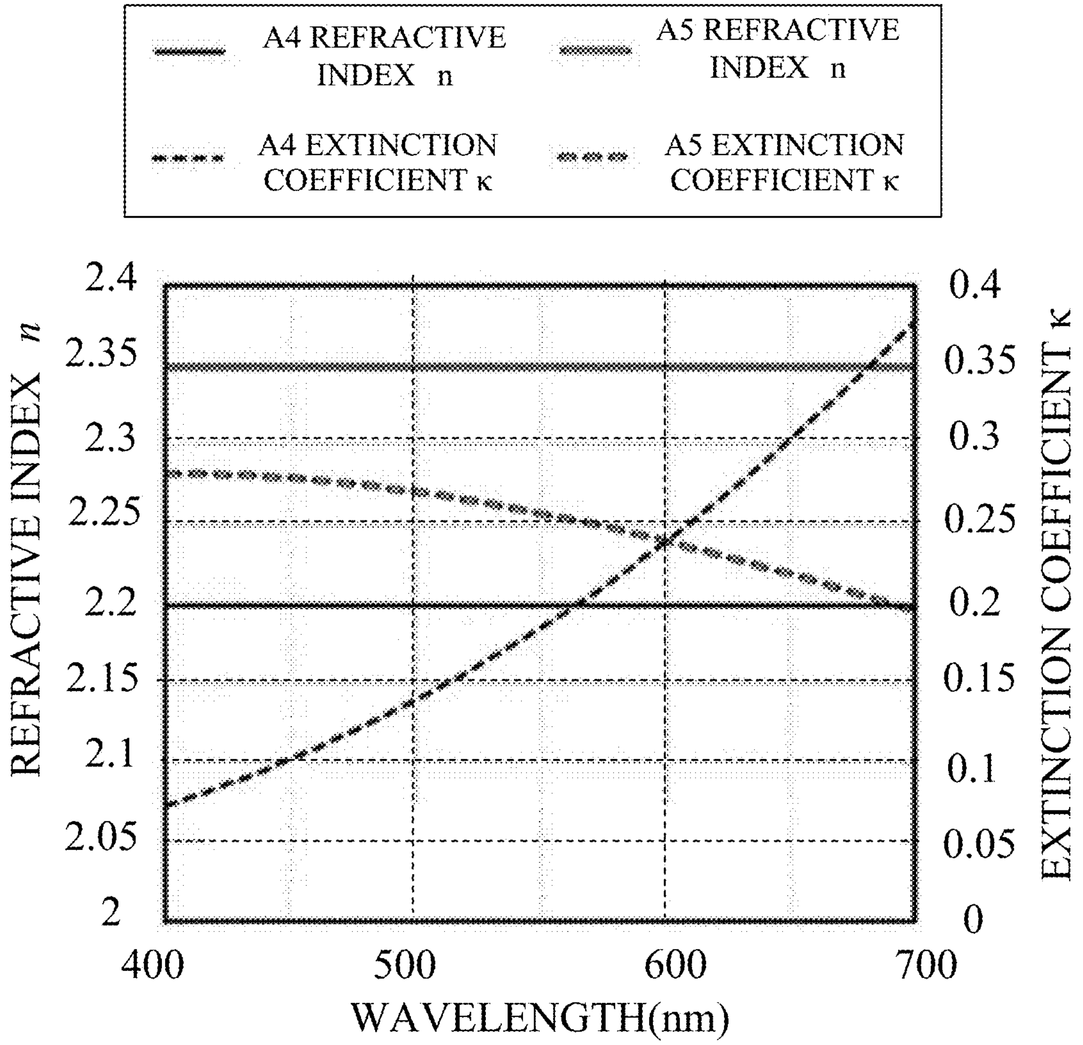
FIG. 14 illustrates a refractive index and an extinction coefficient of the absorption layer of the optical element according to Example 4.

In this embodiment, a glass material S1 is used as the light transmitting member 1, and an adhesive S5 is used as the light transmitting member 5. The glass material S1 and the adhesive S5 are made of non-absorbing materials (non-absorption layers). In this embodiment, each of the antireflection layers 2 and 4 includes alternating layers of the film materials M1 and H1. The film materials M1 and H1 are also made of non-absorbing materials. In this embodiment, the absorption layer 3 includes a thin film 31 (absorbing material A4) and a thin film 32 (absorbing material A5). Each material (glass material S1, adhesive S5, film materials M1 and H1) of the optical element according to this example has a refractive index as illustrated in FIG. 5. FIG. 14 illustrates the refractive index n and the extinction coefficient k of each of the absorption layers 3 (absorbing materials A4 and A5). In FIG. 14, the abscissa axis represents a wavelength (nm), and the ordinate axes represent a refractive index n and an extinction coefficient k. In FIG. 14, a solid line represents the refractive index n, and a broken line represents the extinction coefficient k. In the wavelength range of 400 to 700 nm, the extinction coefficient k of the absorbing material A4 satisfies $0.07 \le k \le 0.38$, and the extinction coefficient k of the absorbing material A5 satisfies $0.20 \le k \le 0.28$.

Figure 15:
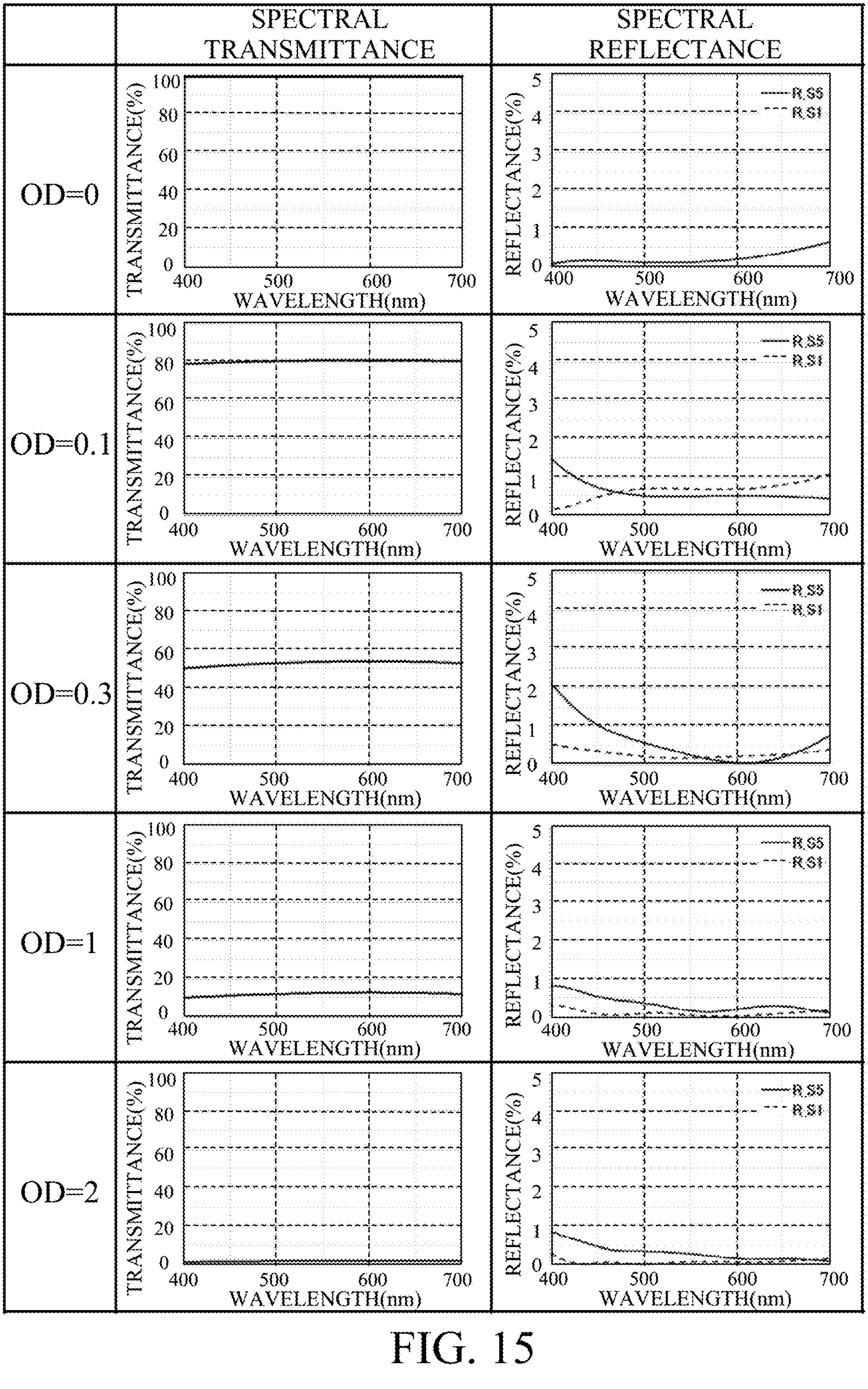
FIG. 15 illustrates a spectral transmittance and a spectral reflectance of the optical element according to Example 4.

FIG. 15 illustrates the spectral transmittance and the spectral reflectance of the optical element (optical filter) according to this example. In FIG. 15, R_S5 represents the spectral reflectance when the light is incident from the light transmitting member 5 (adhesive S5) side, and R_S1 represents the spectral reflectance when the light is incident from the light transmitting member 1 (glass material S1) side. Since the optical element according to this example satisfies the conditional expression (2), both the spectral reflectance R_S5 and the spectral reflectance R_S1 realize a low reflectance.

TABLE 4

| | | material | refractive index (λ = 550 nm) | physical film thickness(nm) |
|---|---|---|---|---|
| transparent material 5 | adhesive | S5 | 1.55 | — |
| antireflection layer 4 | thin film 44 | M1 | 1.65 | 65.4 |
| | thin film 43 | H1 | 2.1 | 10.3 |
| | thin film 42 | M1 | 1.65 | 21.3 |
| | thin film 41 | H1 | 2.1 | 52.4 |
| absorption layer 3 | thin film 32 | A5 | 2.35 | 0~1000 |
| | thin film 31 | A4 | 2.2 | 0~1000 |
| antireflection layer 2 | thin film 24 | H1 | 2.1 | 56.1 |
| | thin film 23 | M1 | 1.65 | 37.6 |
| | thin film 22 | H1 | 2.1 | 18.2 |
| | thin film 21 | M1 | 1.65 | 41.7 |
| transparent material 1 | glass material | S1 | 1.75 | — |

Example 5

Referring to FIGS. 1A, 1B, 7, 13, 16, and 17, a description will be given of an optical element according to Example 5 of the present invention. In the optical element of this example, similar to the optical element described with reference to FIGS. 1A and 1B and FIG. 13, a gradation type ND filter (optical filter), in which the transmittance gradually decreases from the center (optical axis) to the peripheral portion on the optical plane, is sandwiched between the light transmitting members 1 and 5. Table 5 shows a film configuration of the optical filter according to this example.

Figure 16:
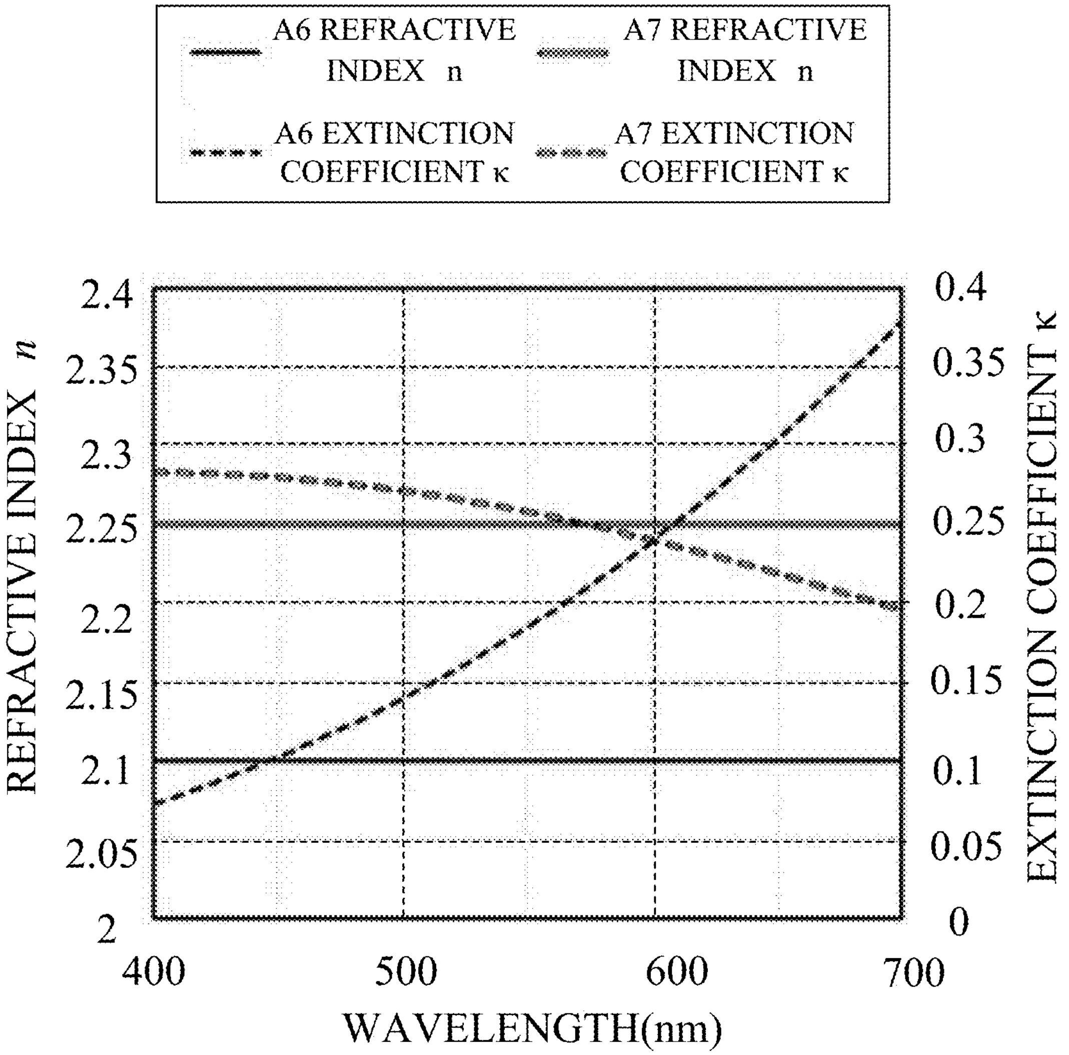
FIG. 16 illustrates a refractive index and an extinction coefficient of the absorption layer in the optical element according to Example 5.

In this embodiment, a glass material S2 is used as the light transmitting member 1, and an adhesive S5 is used as the light transmitting member 5. The glass material S2 and the adhesive S5 are made of non-absorbing materials (non-absorption layers). In this embodiment, each of the antireflection layers 2 and 4 includes alternating layers of the film materials M2 and H2. The film materials M2 and H2 are also made of non-absorbing materials. In this embodiment, the absorption layer 3 includes a thin film 31 (absorbing material A6) and a thin film 32 (absorbing material A7). Each material (glass material S2, adhesive S5, film materials M2 and H2) of the optical element according to this embodiment has a refractive index as illustrated in FIG. 7. FIG. 16 illustrates the refractive index n and the extinction coefficient k of each of the absorption layers 3 (absorbing materials A6 and A7). In FIG. 16, the abscissa axis represents a wavelength (nm), and the ordinate axes represent a refractive index n and an extinction coefficient k. In FIG. 16, a solid line represents the refractive index n, and a broken line represents the extinction coefficient k. In the wavelength range of 400 to 700 nm, the extinction coefficient k of the absorbing material A6 satisfies $0.07 \leq k \leq 0.38$, and the extinction coefficient k of the absorbing material A7 satisfies $0.20 \leq k \leq 0.28$.

Figure 17:
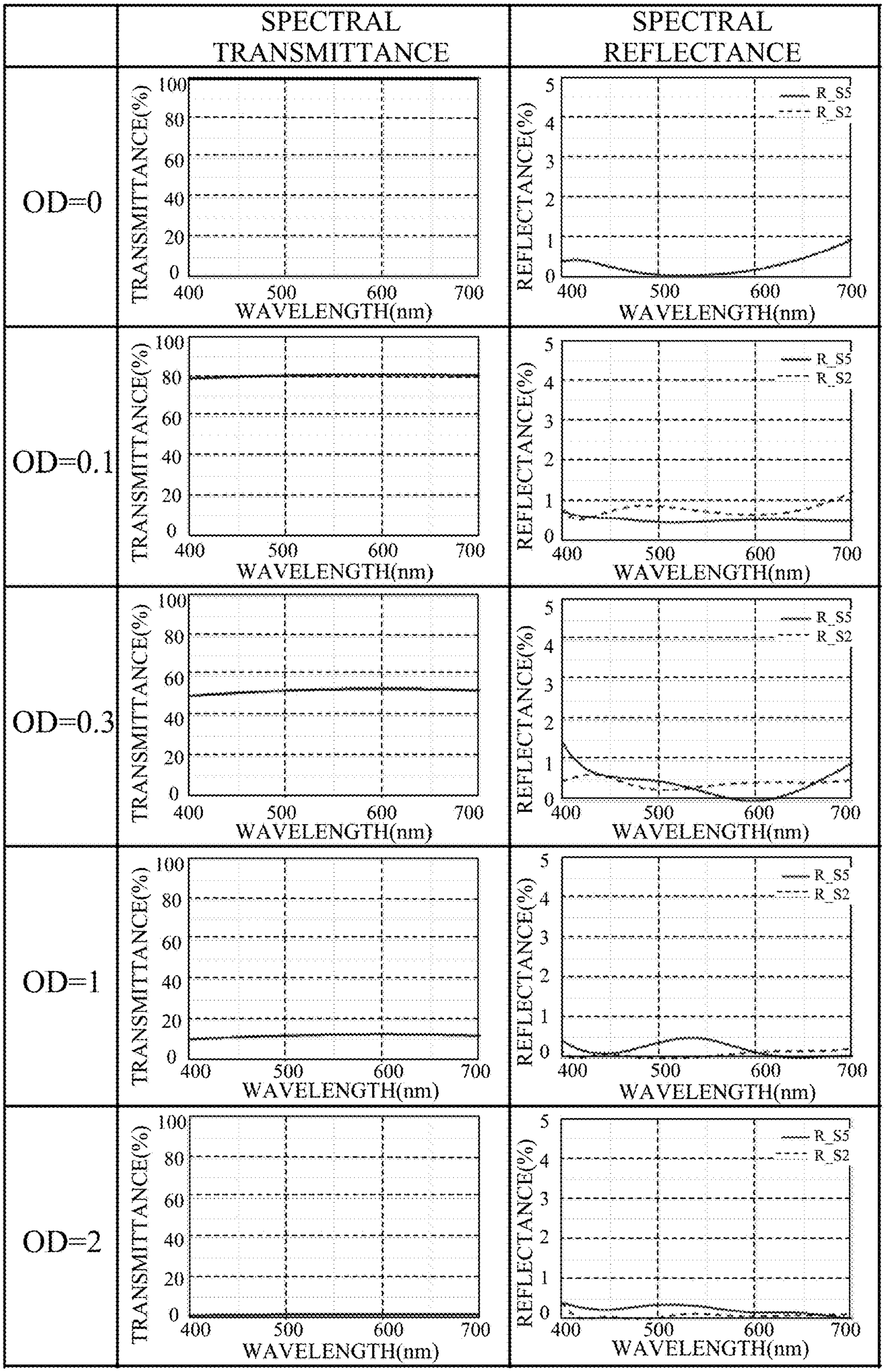
FIG. 17 illustrates a spectral transmittance and a spectral reflectance of the optical element according to Example 5.

FIG. 17 illustrates the spectral transmittance and the spectral reflectance of the optical element (optical filter) according to this example. In FIG. 17, R_S5 represents the spectral reflectance when the light is incident from the light transmitting member 5 (adhesive S5) side, and R_S2 represents the spectral reflectance when the light is incident from the light transmitting member 1 (glass material S2) side. Since the optical element according to this example satisfies the conditional expression (2), both the spectral reflectance R_S5 and the spectral reflectance R_S2 realize a low reflectance.

TABLE 5

| | | material | refractive index (λ = 550 nm) | physical film thickness(nm) |
|---|---|---|---|---|
| transparent material 5 | adhesive | S5 | 1.55 | — |
| antireflection layer 4 | thin film 44 | M2 | 1.45 | 11.1 |
| | thin film 43 | H2 | 2.0 | 20.0 |
| | thin film 42 | M2 | 1.45 | 29.6 |
| | thin film 41 | H2 | 2.0 | 73.3 |
| absorption layer 3 | thin film 32 | A7 | 2.25 | 0~1000 |
| | thin film 31 | A6 | 2.1 | 0~1000 |
| antireflection layer 2 | thin film 24 | H2 | 2.0 | 63.8 |
| | thin film 23 | M2 | 1.45 | 17.3 |
| | thin film 22 | H2 | 2.0 | 40.4 |
| | thin film 21 | M2 | 1.45 | 14.0 |
| transparent material 1 | glass material | S2 | 1.9 | — |

Example 6

Referring now to FIGS. 1A, 1B, 13, 14, 18, and 19, a description will be given of an optical element according to Example 6 of the present invention. In the optical element according to this example, similar to the optical element described with reference to FIGS. 1A, 1B, and 13, a gradation type ND filter (optical filter), in which the transmittance gradually decreases from the center (optical axis) to the peripheral portion on the optical surface, is sandwiched between the light transmitting members 1 and 5. Table 6 shows a film configuration of the optical filter according to this example.

Figure 18:
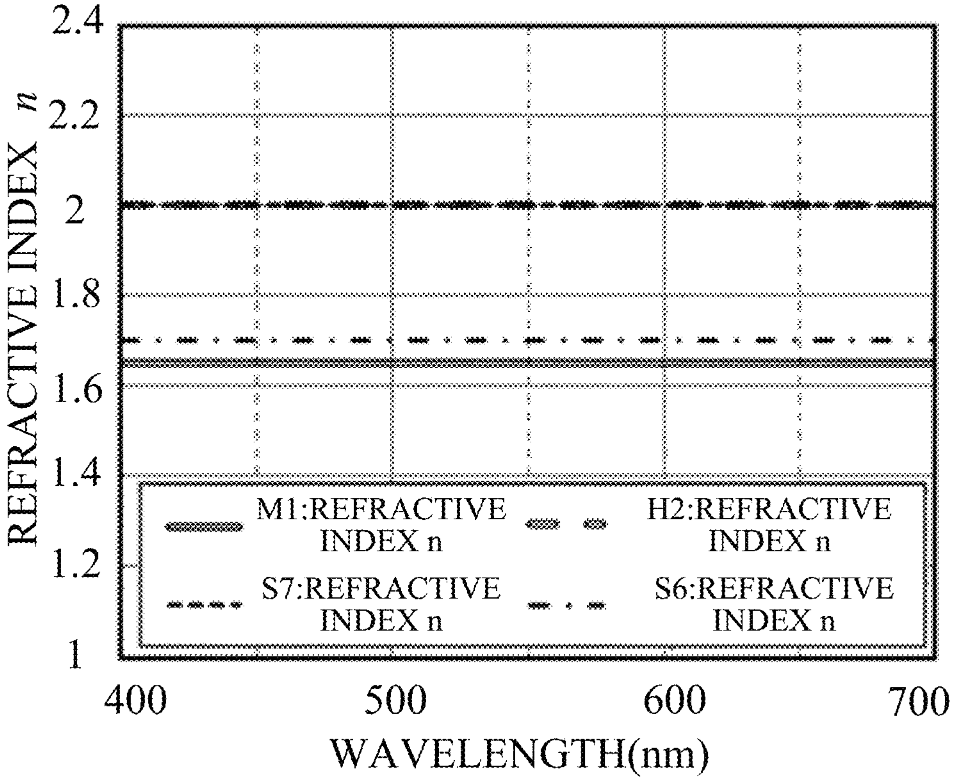
FIG. 18 illustrates a refractive index of each material in an optical element according to Example 6.

In this embodiment, a glass material S7 is used as the light transmitting member 1, and an adhesive S6 is used as the light transmitting member 5. The glass material S7 and the adhesive S6 are made of non-absorbing materials (non-absorption layers). In this embodiment, each of the antireflection layers 2 and 4 includes alternating layers of the film materials M1 and H2. The film materials M1 and H2 are also made of non-absorbing materials. In this embodiment, the absorption layer 3 includes a thin film 31 (absorbing material A6) and a thin film 32 (absorbing material A7). FIG. 18 illustrates the refractive index of each material (glass material S7, adhesive S6, film materials M1 and H2) in the optical element according to this example. Each refractive index n and extinction coefficient k of the absorption layer 3 (absorbing materials A6 and A7) are as illustrated in FIG. 14.

Figure 19:
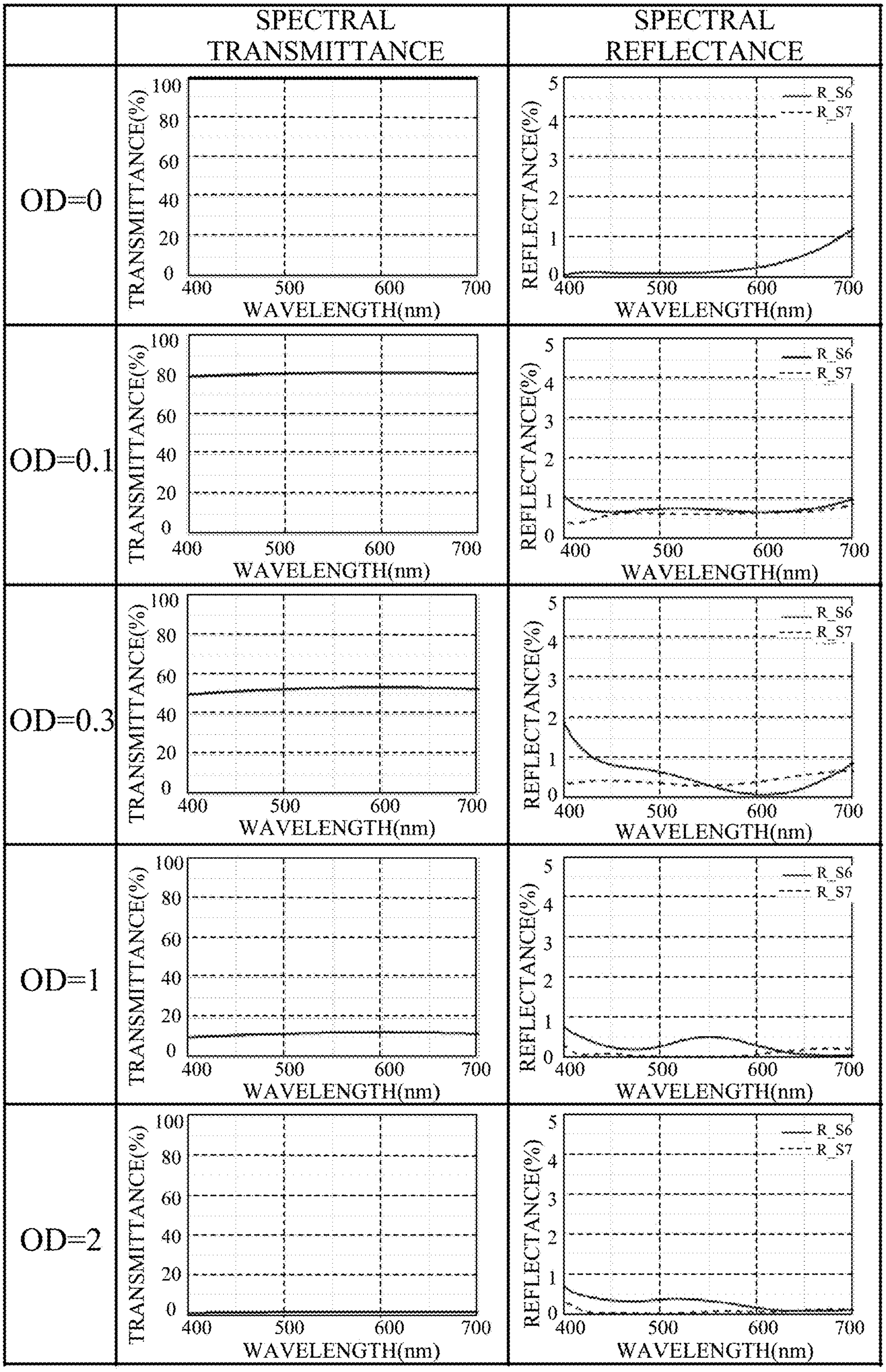
FIG. 19 illustrates the spectral transmittance and the spectral reflectance of the optical element according to Example 6.

FIG. 19 illustrates the spectral transmittance and the spectral reflectance of the optical element (optical filter) according to this example. In FIG. 19, R_S6 represents the spectral reflectance when the light is incident from the light transmitting member 5 (adhesive S5) side, and R_S7 represents the spectral reflectance when the light is incident from the light transmitting member 1 (glass material S7) side. Since the optical element according to this example satisfies the conditional expression (2), both the spectral reflectance R_S5 and the spectral reflectance R_S2 realize a low reflectance.

TABLE 6

| | | material | refractive index (λ = 550 nm) | physical film thickness(nm) |
|---|---|---|---|---|
| transparent material 5 | adhesive | S6 | 1.70 | — |
| antireflection layer 4 | thin film 44 | M1 | 1.65 | 87.5 |
| | thin film 43 | H2 | 2.0 | 8.0 |
| | thin film 42 | M1 | 1.65 | 46.0 |
| | thin film 41 | H2 | 2.0 | 65.0 |
| absorption layer 3 | thin film 32 | A7 | 2.25 | 0~1000 |
| | thin film 31 | A6 | 2.1 | 0~1000 |
| antireflection layer 2 | thin film 24 | H2 | 2.0 | 52.4 |
| | thin film 23 | M1 | 1.65 | 158.4 |
| | thin film 22 | H2 | 2.0 | 29.6 |
| | thin film 21 | M1 | 1.65 | 15.4 |
| transparent material 1 | glass material | S7 | 2.0 | — |

Example 7

Figure 21:
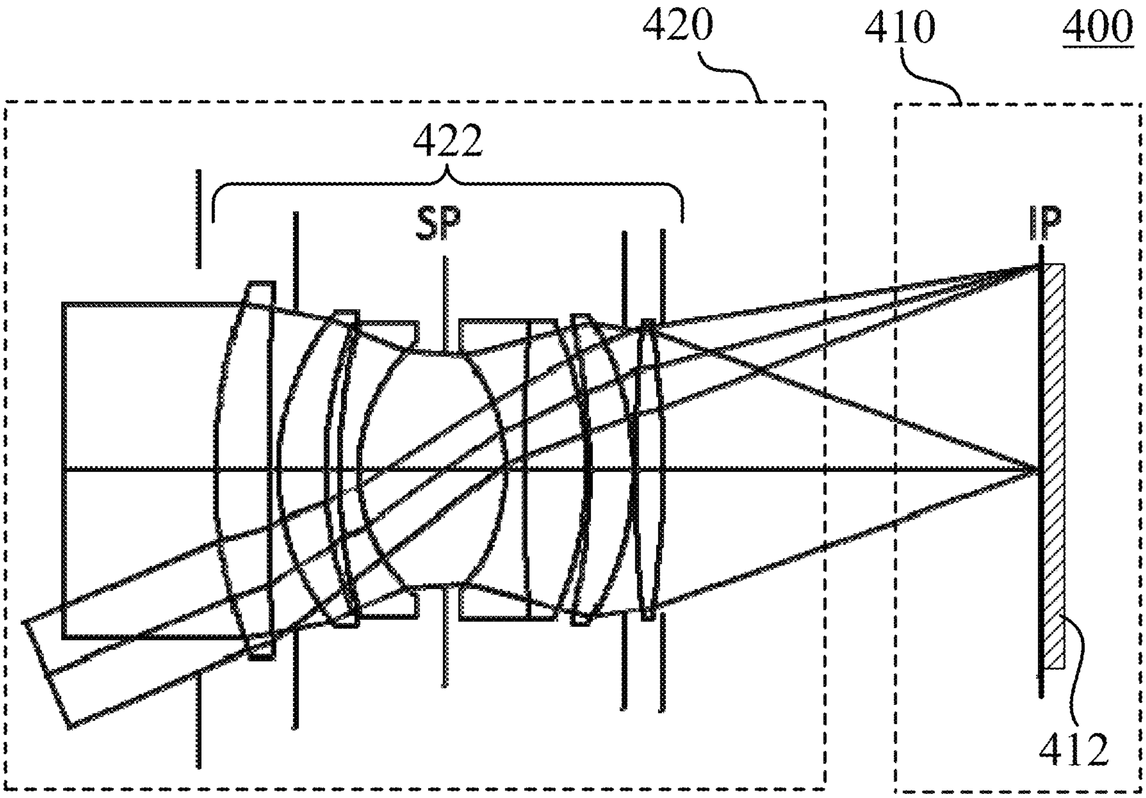
FIG. 21 is a sectional view of the imaging apparatus according to Example 7.

Referring now to FIG. 21, a description will be given of an imaging apparatus (optical apparatus) according to Example 7 of the present invention. FIG. 21 is a sectional view of the imaging apparatus 400 according to this embodiment. The imaging apparatus 400 includes an imaging apparatus body 410 and a lens apparatus 420 attachable to and detachable from the imaging apparatus body 410. However, this example is not limited to this configuration, and is applicable to an imaging apparatus in which an imaging apparatus body and a lens apparatus are integrated with each other. The lens apparatus 420 includes a plurality of optical elements (lens unit) 422 and an aperture stop (diaphragm) SP, and constitutes an optical system (imaging optical system). The imaging apparatus body 410 includes an image sensor 412, such as a CMOS sensor. The image sensor 412 is disposed on the imaging plane IP, photoelectrically converts an object image formed via an optical system, and outputs image data.

The object image is formed on the imaging plane IP through the optical system. In this embodiment, the optical element (gradation type ND filter) of any one of Examples 1 to 6 is provided on at least one surface of the stop SP or the lens surface before and after the stop SP. However, this embodiment is not limited to this example, and an optical filter may be provided on another lens surface of the optical system.

The optical system illustrated in FIG. 21 is a coaxial rotationally symmetric optical system. This type of optical system may use an optical filter having a concentric transmittance distribution as illustrated in FIGS. 20A and 20B. Advantageously, a transmittance decrease caused by the optical filter can be suppressed by providing an area in which the thickness of the absorption layer 3 is 0 (or no absorption layer 3 is provided) at the center of the optical filter 100 (a central area including the optical axis), as illustrated in FIGS. 1A and 1B. Where the imaging apparatus 400 having a phase difference detection type autofocus mechanism (AF mechanism) may include an area where the thickness of the absorption layer is 0 at the center area so that the transmittance of the light beam used for the phase difference detection does not change.

The gradation type ND satisfying T(r1)≥T(r2) where T(r1) and T(r2) are transmittances at distances r1 and r2 (r1<r2) from the center (optical axis) of the optical surface can provide a high-quality blurred image due to the apodization effect. Disposing the gradation type ND filter of each example before and after the stop SP can effectively provide the apodization effect even with an off-axis light beam and a high-quality image over the entire image. On the other hand, The gradation type ND filter having characteristics such as T(r1)≤T(r2) can correct the peripheral light attenuation of the image.

When an optical filter is provided at such a position, the reflected light usually may become stray light and cause ghost sand flares. However, the gradation type ND filter according to each example can reduce the reflectance while maintaining the transmittance distribution, and can provide a high-quality image that reduces the ghosts and flares for light from both the image side and the object side. The sectional view illustrated in FIG. 21 is merely illustrative, and the optical filter according to each embodiment is not limited to a lens of one imaging optical system, and is applicable to a variety of optical systems.

Each example can provide an easily manufactured gradation type ND filter having a high antireflection effect on light incident from the substrate side and the opposite side of the substrate for areas having different transmittances on the substrate surface. Hence, each example can provide an optical element, an optical system, and an optical apparatus having a high antireflection performance for areas having different transmittances.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-212708, filed on Nov. 13, 2018, which is hereby incorporated by reference herein in its entirety.

What is claimed is:

1. An optical element having an area in which a transmittance varies, the optical element comprising:

first and second antireflection layers;

an absorption layer disposed between the first and second antireflection layers; and first and second light transmitting members, wherein the first and second antireflection layers are disposed between the first and second light transmitting members, wherein the absorption layer includes a first film adjacent to the first antireflection layer and a second film adjacent to the second antireflection layer, wherein the first antireflection layer includes a third film adjacent to the first film, wherein the second antireflection layer includes a fourth film adjacent to the second film, and wherein the following conditional expressions are satisfied, $$|n_A-n_1|\leq 0.35, \text{ and}$$

$$|n_B-n_2|\leq 0.35,$$

where $n_A$ is a refractive index of the first film, $n_B$ is a refractive index of the second film, $n_1$ is a refractive index of the third film, and $n_2$ is a refractive index of the fourth film.

2. The optical element according to claim 1, wherein the following conditional expression is satisfied, $$|N_s-N_g|\leq 0.45,$$

where $N_s$ is a refractive index of the first light transmitting member and $N_g$ is a refractive index of the second light transmitting member.

3. The optical element according to claim 1, wherein the number of films of the first antireflection layer is equal to the number of films of the second antireflection layer.

4. The optical element according to claim 1, wherein the first antireflection layer includes a plurality of films including the third film, and the second antireflection layer includes a plurality of films including the fourth film.

5. The optical element according to claim 1, wherein the first and second films are the same material.

6. The optical element according to claim 1, wherein the absorption layer includes a plurality of films including the first and second films.

7. The optical element according to claim 1, wherein the absorption layer has a concentric film thickness distribution.

8. The optical element according to claim 1, wherein a film thickness of the absorption layer increases from a center to a peripheral portion.

9. The optical element according to claim 1, wherein the absorption layer is not provided at a center in a radial direction.

10. The optical element according to claim 1, wherein the following conditional expression is satisfied $$0.05\leq k\leq 0.35,$$

where k is an extinction coefficient of the absorption layer.

11. An optical system comprising a plurality of optical elements, one of which has an area in which a transmittance varies and includes:

first and second antireflection layers;

an absorption layer disposed between the first and second antireflection layers; and first and second light transmitting members, wherein the first and second antireflection layers are disposed between the first and second light transmitting members, wherein the absorption layer includes a first film adjacent to the first antireflection layer and a second film adjacent to the second antireflection layer, wherein the first antireflection layer includes a third film adjacent to the first film, wherein the second antireflection layer includes a fourth film adjacent to the second film, and wherein the following conditional expressions are satisfied, $$|n_A-n_1|\leq 0.35, \text{ and}$$

$$|n_B - n_2| \leq 0.35,$$

where $n_A$ is a refractive index of the first film, $n_B$ is a refractive index of the second film, $n_1$ is a refractive index of the third film, and $n_2$ is a refractive index of the fourth film.

12. An optical apparatus comprising:

an image sensor;

an optical element having an area in which a transmittance varies; and first and second light transmitting members, wherein the first and second antireflection layers are disposed between the first and second light transmitting members, wherein the optical element includes:

first and second antireflection layers; and an absorption layer disposed between the first and second antireflection layers, wherein the absorption layer includes a first film adjacent to the first antireflection layer and a second film adjacent to the second antireflection layer, wherein the first antireflection layer includes a third film adjacent to the first film, wherein the second antireflection layer includes a fourth film adjacent to the second film, and wherein the following conditional expressions are satisfied, $$|n_A - n_1| \leq 0.35, \text{ and}$$

$$|n_B - n_2| \leq 0.35,$$

where $n_A$ is a refractive index of the first film, $n_B$ is a refractive index of the second film, $n_1$ is a refractive index of the third film, and $n_2$ is a refractive index of the fourth film.

13. The optical element according to claim 1, wherein the following conditional expressions are satisfied, $$N_s > 1.40, \text{ and}$$

$$N_g > 1.40,$$

where $N_s$ is a refractive index of the first light transmitting member and $N_g$ is a refractive index of the second light transmitting member.

* * * * *